(12) United States Patent
Ikeda et al.

(10) Patent No.: US 9,002,513 B2
(45) Date of Patent: Apr. 7, 2015

(54) ESTIMATING APPARATUS, ESTIMATING METHOD, AND COMPUTER PRODUCT

(71) Applicant: Fujitsu Limited, Kawasaki-shi (JP)

(72) Inventors: Hiroshi Ikeda, Kawasaki (JP); Kouichi Kumon, Ota (JP)

(73) Assignee: Fujitsu Limited, Kawasaki (JP)

( * ) Notice: Subject to any disclaimer, the term of this patent is extended or adjusted under 35 U.S.C. 154(b) by 327 days.

(21) Appl. No.: 13/628,256

(22) Filed: Sep. 27, 2012

(65) Prior Publication Data
US 2013/0116819 A1    May 9, 2013

(30) Foreign Application Priority Data
Nov. 9, 2011    (JP) .................................. 2011-245980

(51) Int. Cl.
*G06F 19/00*    (2011.01)
*G06F 17/50*    (2006.01)
*G05B 13/00*    (2006.01)
*G06N 3/00*    (2006.01)

(52) U.S. Cl.
CPC ................ *G06F 19/00* (2013.01); *G06F 17/50* (2013.01); *G06F 17/5009* (2013.01); *G05B 13/00* (2013.01); *G06N 3/008* (2013.01)

(58) Field of Classification Search
USPC .......... 700/245–264; 701/116–119, 408, 468, 701/469, 479, 480, 494, 495, 509, 510, 518, 701/535, 536; 901/1–50
See application file for complete search history.

(56) References Cited

FOREIGN PATENT DOCUMENTS

| JP | 2005-032196 | 2/2005 |
| JP | 2008-033696 | 2/2008 |
| JP | 2009-176031 | 8/2009 |
| JP | 2009-223504 | 10/2009 |
| JP | 2010-224755 | 10/2010 |

*Primary Examiner* — Khoi Tran
*Assistant Examiner* — Adam Mott
(74) *Attorney, Agent, or Firm* — Fujitsu Patent Center

(57) ABSTRACT

An estimating apparatus includes a processor configured to update a state of a first particle group indicating a state of a mobile body, from a current state to a next state through a simulation that is based on a state equation of the mobile body in a space using a particle filter; measure at each update, a distance between the mobile body and an object in the space; generate at each update, a second particle group indicating a state of a specific area in the space; calculate a level of likelihood for each particle of the first particle group and for each particle of the second particle group, based on the measured distance, the updated first particle group, and the generated second particle group; and identify a position of the mobile body in the space, based on the level of likelihood calculated for each particle.

8 Claims, 22 Drawing Sheets

FIG.4

DANGEROUS AREA TABLE — 400

| AREA ID | NEIGHBORING AREA | ANXIETY PARTICLE ID LIST |
|---|---|---|
| area1 | R1 | a1, a2, ..., an |
| ⋮ | ⋮ | ⋮ |

FIG.5

PARTICLE TABLE — 500

| PARTICLE ID | VARIABLE 1 | VARIABLE 2 | ... | VARIABLE k |
|---|---|---|---|---|
| p1 | (22,255,66) | 30 | ... | 45 |
| p2 | (22.255,60) | 30 | ... | 45 |
| p3 | (22,245,56) | 30 | ... | 45 |
| p4 | (22.240,66) | 30 | ... | 45 |

FIG.6

ANXIETY PARTICLE TABLE — 600

| ANXIETY PARTICLE ID | VARIABLE 1 | VARIABLE 2 | ... | VARIABLE k |
|---|---|---|---|---|
| a1 | (10,20,32) | 30 | ... | 45 |
| a2 | (10,20,35) | 30 | ... | 90 |

FIG.7

SENSOR INFORMATION TABLE — 700

| TIME | MEASURE-MENT 1 (m) | MEASURE-MENT 2 (m) | ... | MEASURE-MENT M (m) |
|---|---|---|---|---|
| t1 | 6 | 22 | ... | 100 |
| ⋮ | ⋮ | ⋮ | ⋮ | ⋮ |

FIG.8

800 — LIKELIHOOD LEVEL TABLE

| PARTICLE ID | LIKELIHOOD LEVEL |
|---|---|
| p1 | 0.5 |
| p2 | 0.1 |
| p3 | 0.2 |
| p4 | 0.2 |

800 — LIKELIHOOD LEVEL TABLE

| PARTICLE ID | LIKELIHOOD LEVEL |
|---|---|
| p1 | 0.7 |
| p2 | 0.5 |
| p3 | 0.1 |
| p4 | 0.1 |

800 — LIKELIHOOD LEVEL TABLE

| PARTICLE ID | LIKELIHOOD LEVEL |
|---|---|
| p1 | 0.9 |
| p2 | 0.5 |
| p3 | 0.3 |
| p4 | 0.1 |

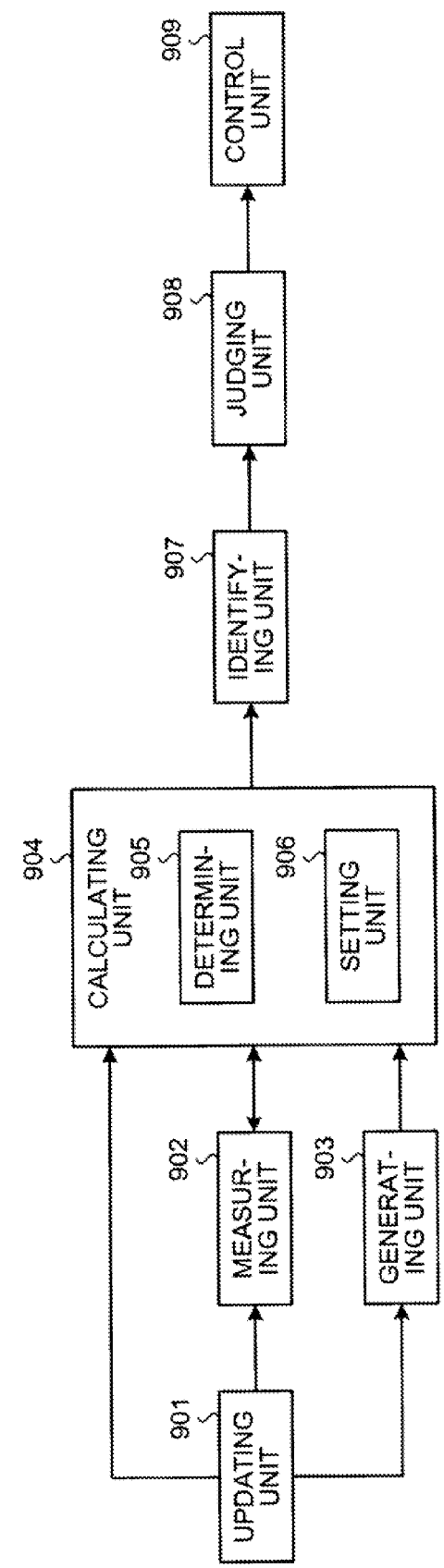

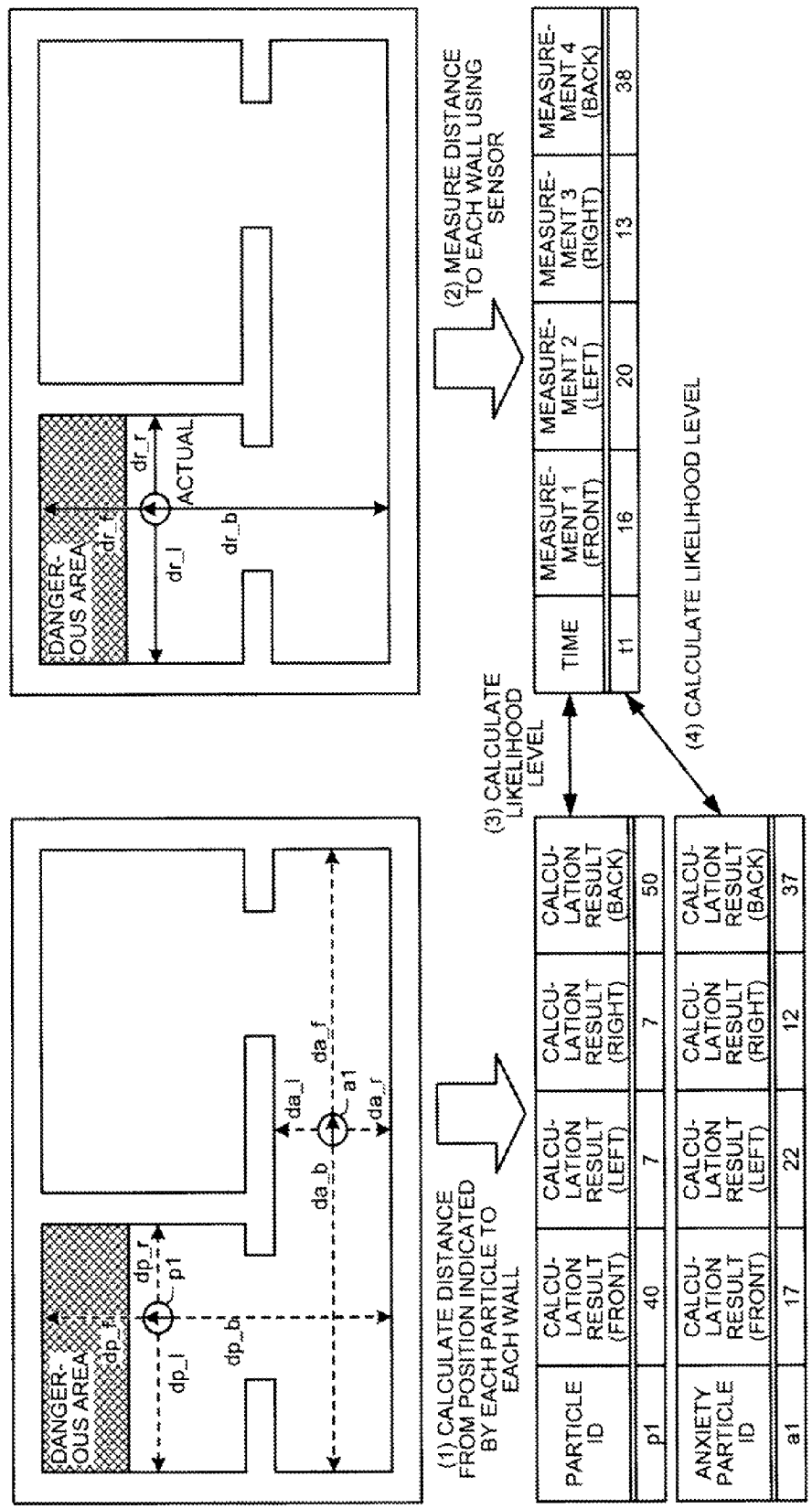

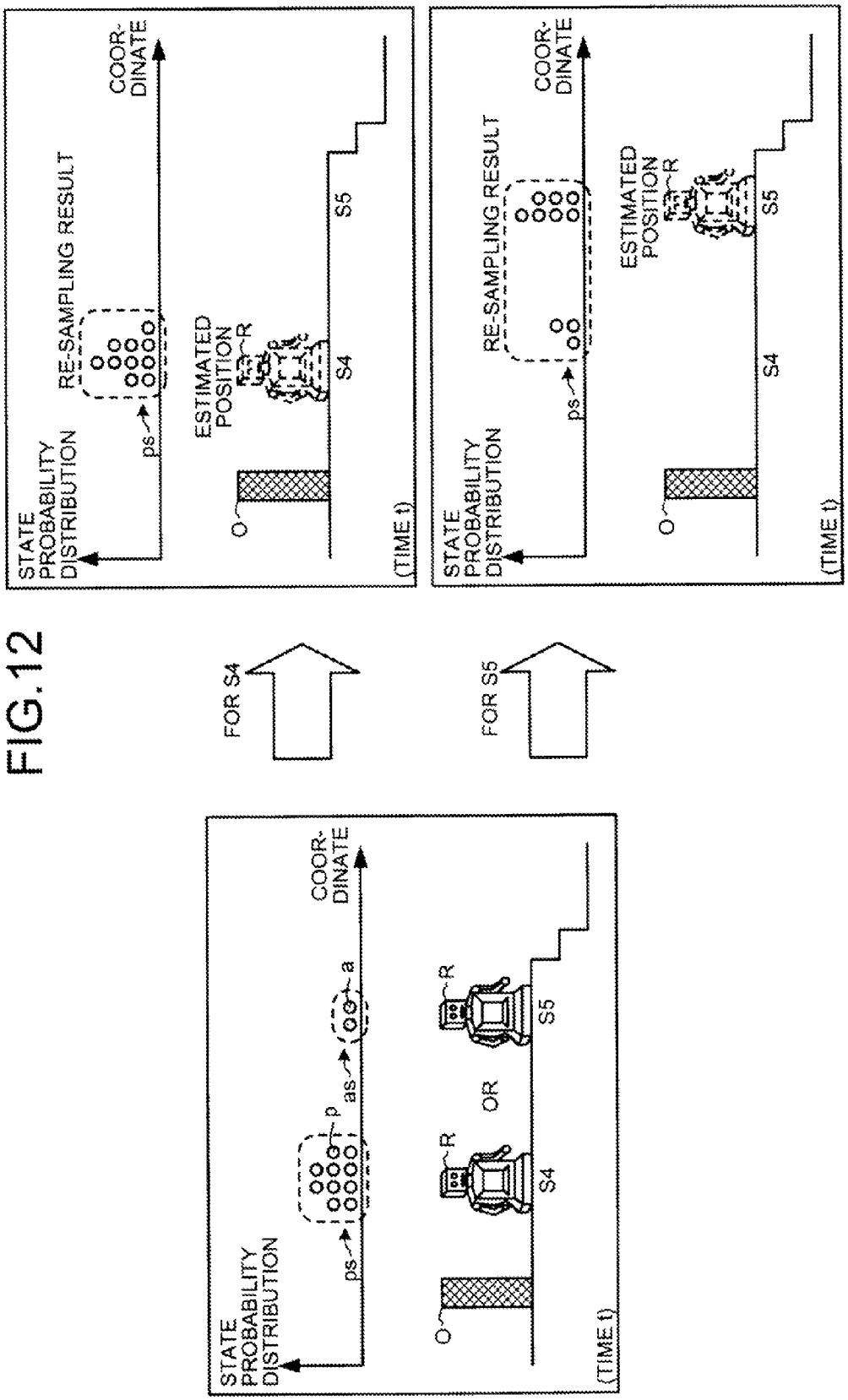

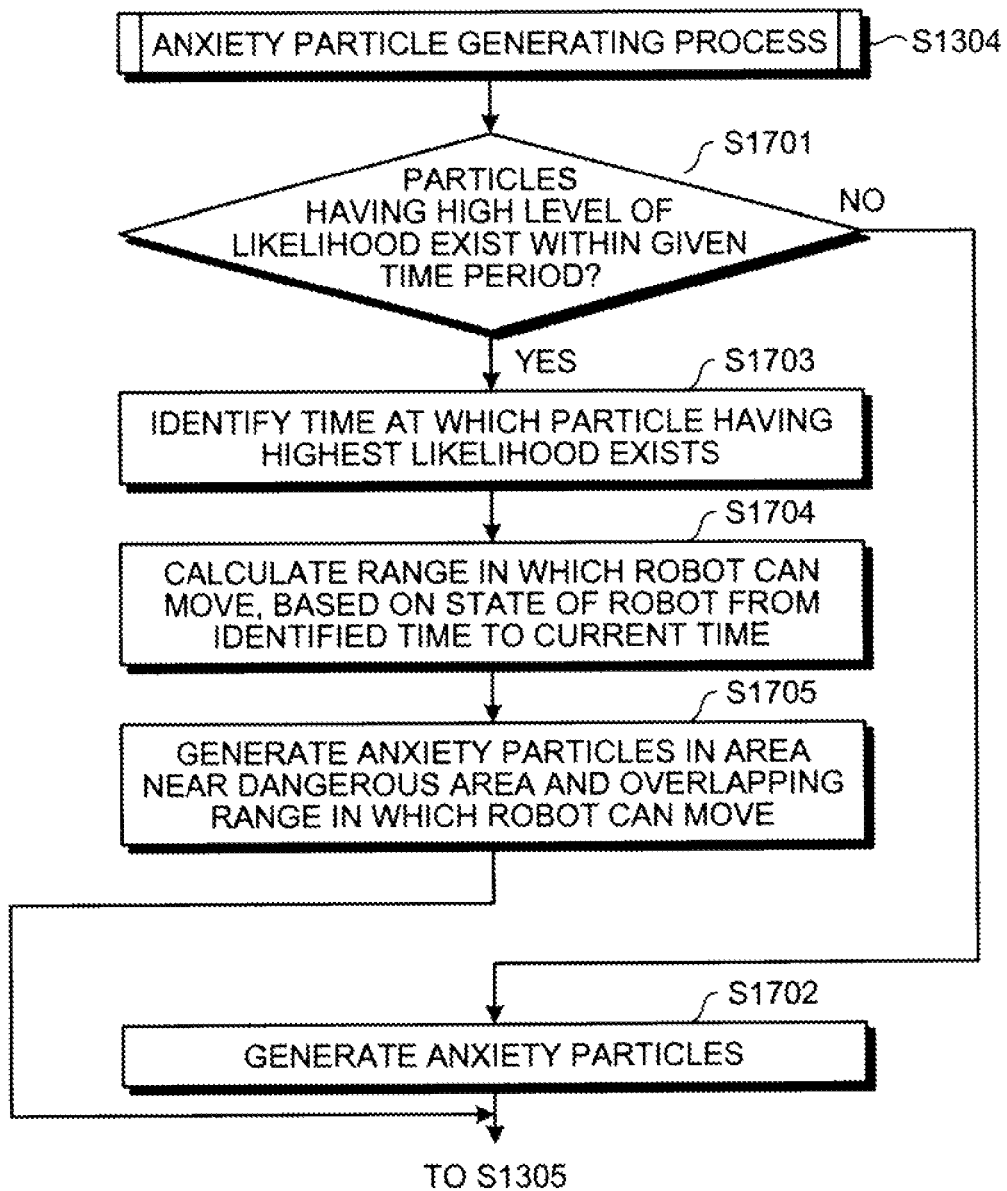

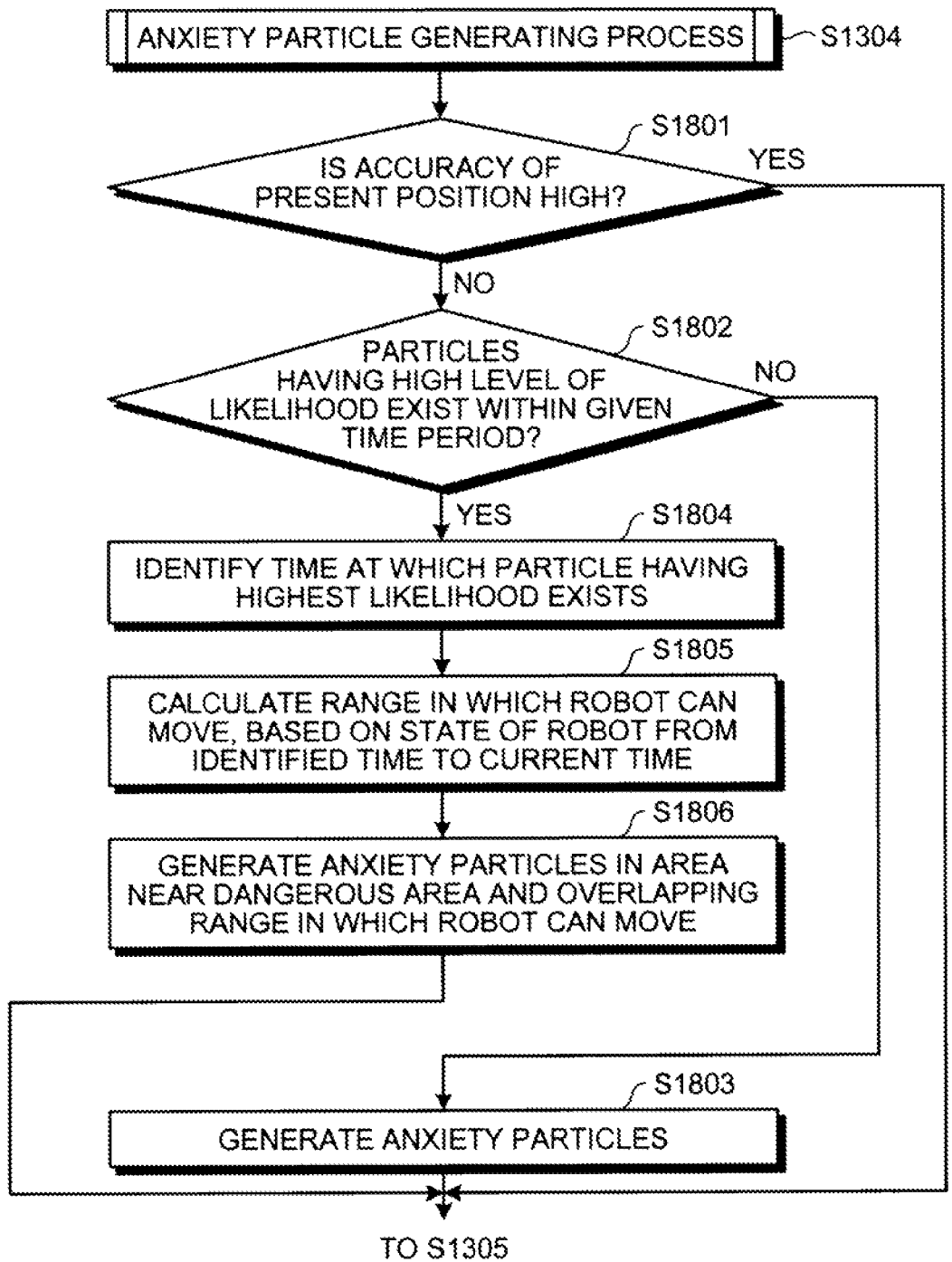

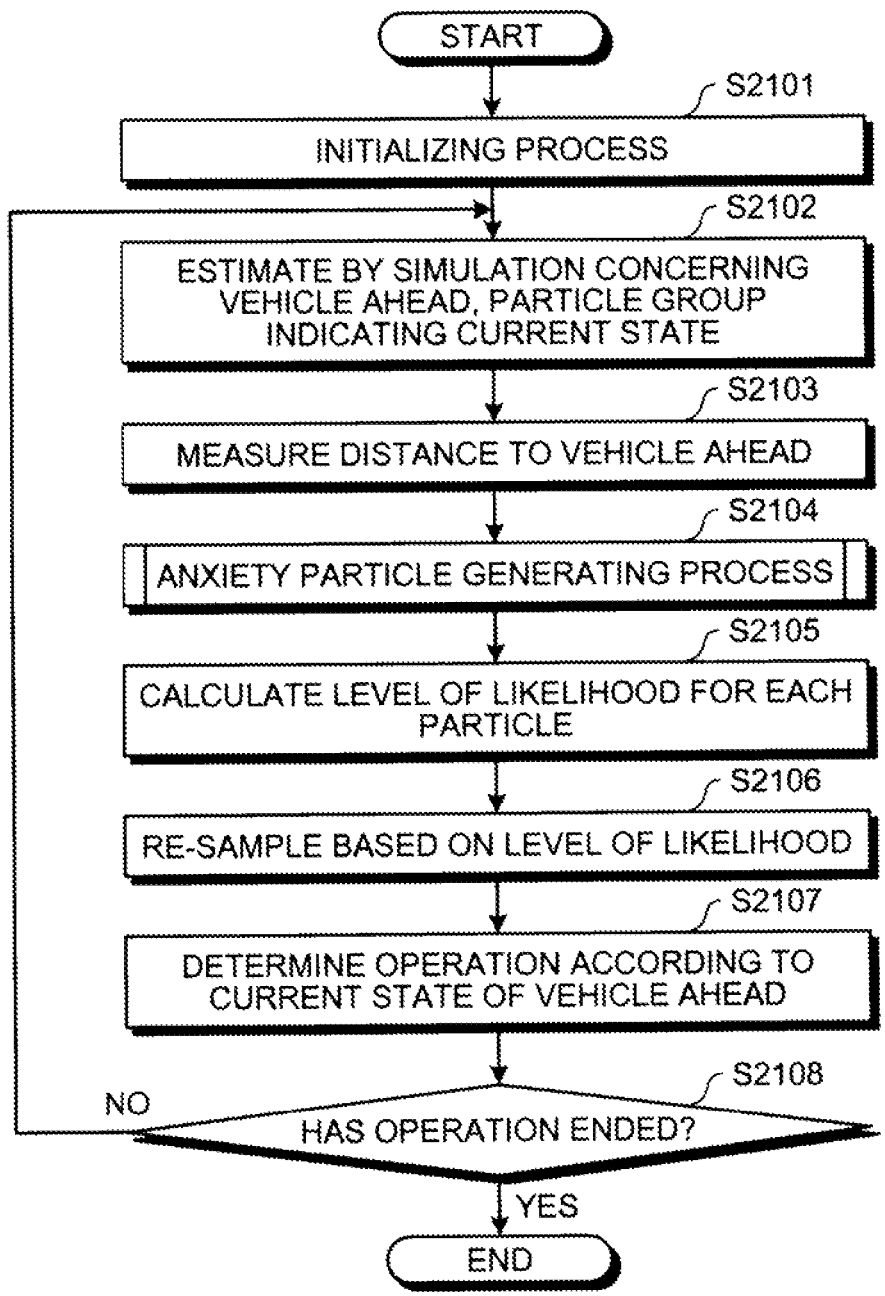

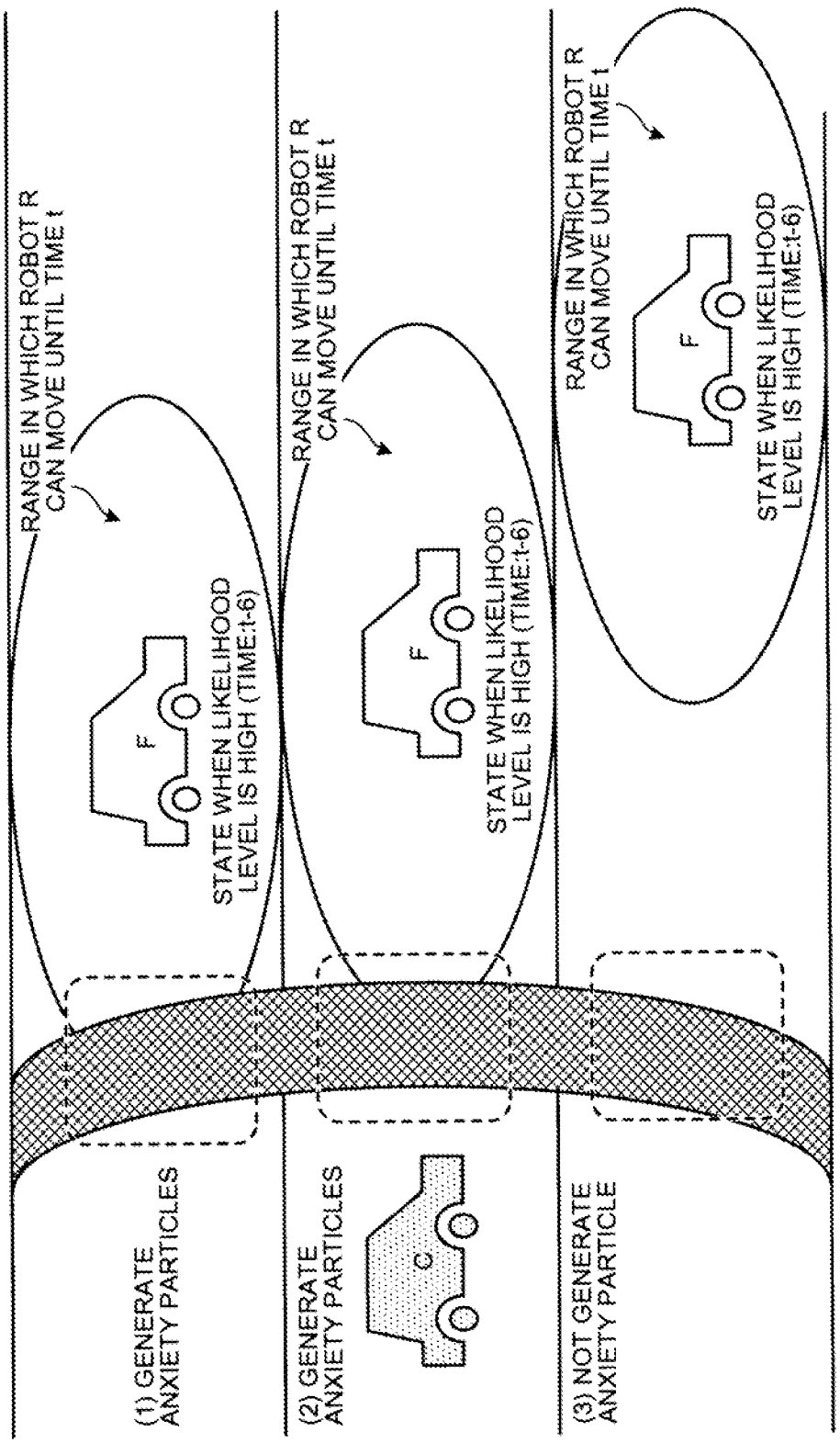

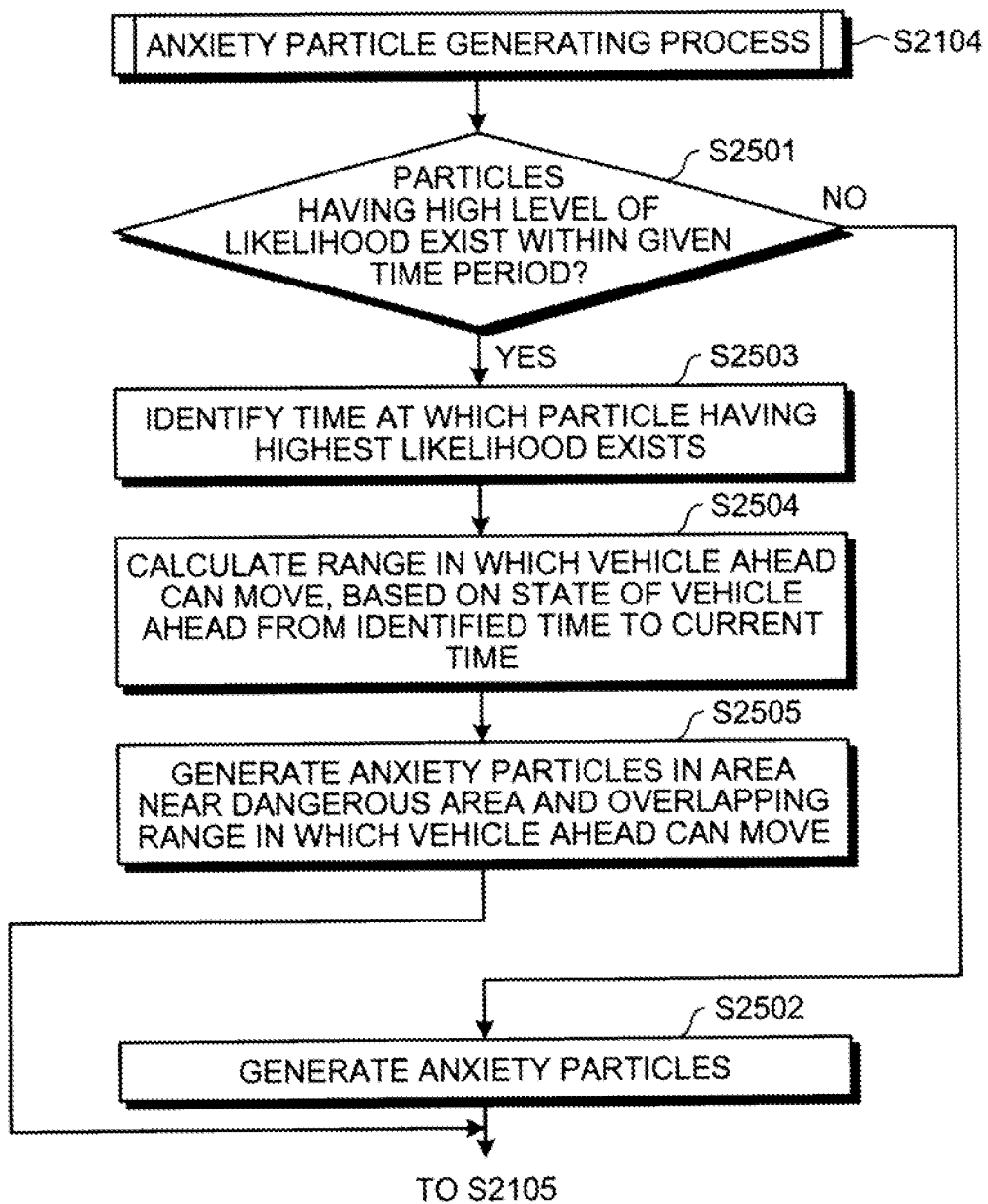

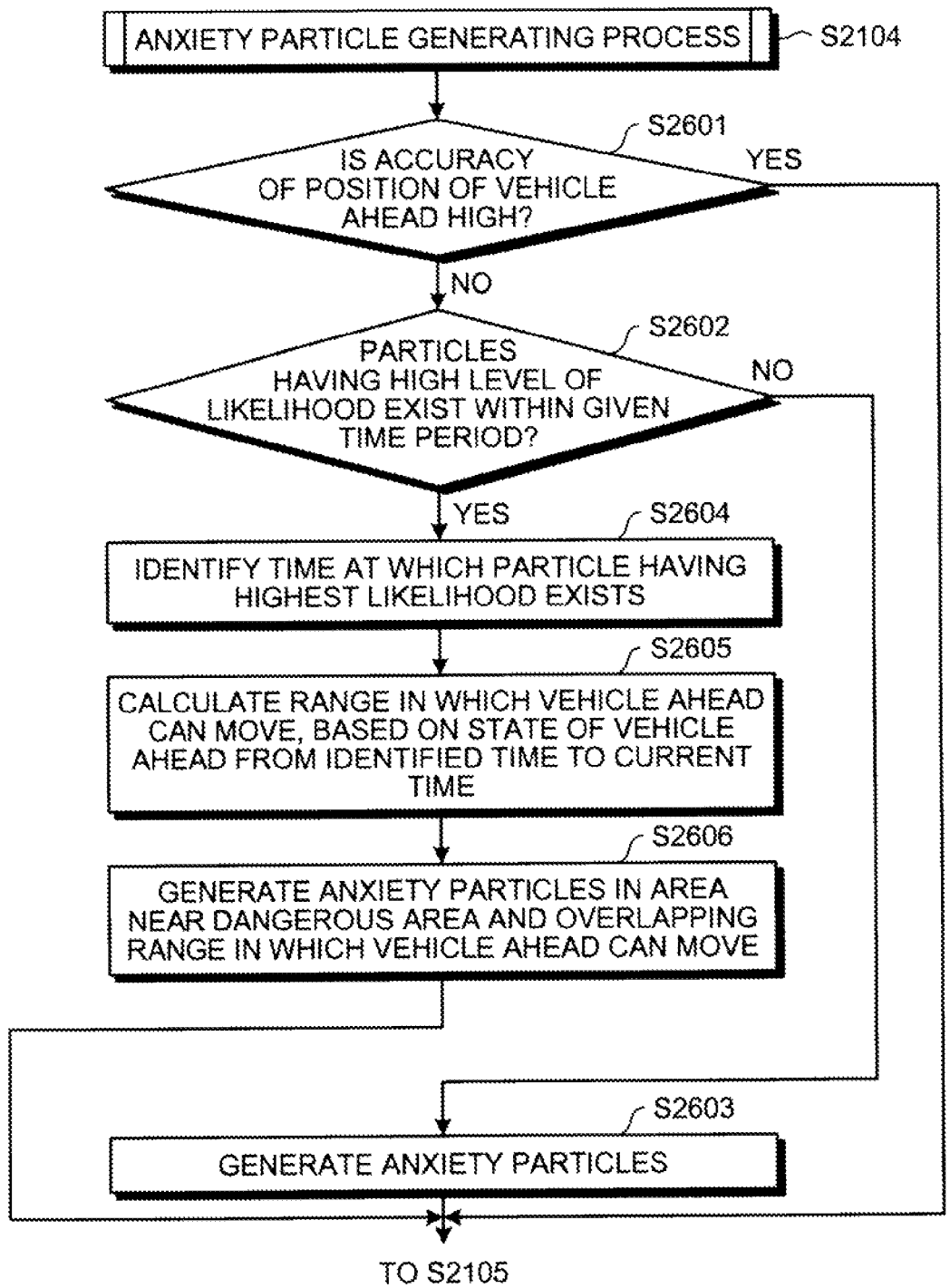

ESTIMATING APPARATUS, ESTIMATING METHOD, AND COMPUTER PRODUCT

CROSS REFERENCE TO RELATED APPLICATIONS

This application is based upon and claims the benefit of priority of the prior Japanese Patent Application No. 2011-245980, filed on Nov. 9, 2011, the entire contents of which are incorporated herein by reference.

FIELD

The embodiments discussed herein are related to an estimating apparatus, an estimating method, and an estimating program.

BACKGROUND

Conventionally, a technique of estimating the state of a mobile body using a particle filter is known. The particle filter is used in a method of approximating a probability distribution of the state of the mobile body based on a set of particles representing a given state of the mobile body.

According to the technique of estimating the state of a mobile body using the particle filter, a particle group representing the current state of the mobile body is estimated from a particle group that represents a past state of the mobile body through simulation. Based on the likelihood (level of likelihood) of each particle in the estimated particle group representing the current state of the mobile body, re-sampling of the particle group is carried out. In re-sampling of the particle group, particles making up the particle group representing the current state of the mobile body are re-selected from among the particle group estimated by simulation, and the current state of the mobile body is re-estimated.

Several examples of re-sampling techniques may be cited. According to one technique, the position of the mobile body is estimated using a particle filter and is corrected by the mobile body based on a measurement from a laser radar of the mobile body (see, e.g., Japanese Laid-Open Patent Publication No. 2009-223504). According to another technique the position of the mobile body is estimated using a particle filter and is corrected by the mobile body based on an ID signal that is received from and unique to an infrared irradiating device (see, e.g., Japanese Laid-Open Patent Publication No. 2009-176031).

According to still another technique, the number of particles used for estimating the state of the mobile body is dynamically changed (see, e.g., Japanese Laid-Open Patent Publication No. 2010-224755). According to another technique, a grid map is generated from a geometric map, whereby a Voronoi graph is created from the generated grid map, using distances corresponding to the uncertainty of the position/orientation of an object, and on the generated Voronoi graph, a path is searched for based on a probability of collision with the object and path length (see, e.g., Japanese Laid-Open Patent Publication No. 2005-32196). According to another technique, the position of the mobile body is estimated by the mobile body by integrating information from multiple sensors (see, e.g., Japanese Laid-Open Patent Publication No. 2008-33696).

According to the above conventional techniques, however, particles representing the true state of the mobile body may not be included in the particle group representing the current state of the mobile body estimated by simulation using the particle filter. Such a case happens, for example, when calculation errors made at each round of the simulation grow in number as the simulation is repeated. In this case, even if a reasonable particle group representing the current state of the mobile body is re-selected from among the estimated particle group indicating the current state of the mobile body through re-sampling, the re-selected particle group may not include the particles indicating the true state of the mobile body. As a result, according to the conventional techniques, the position of the mobile body may be erroneously estimated from the state of the mobile body indicated by the re-selected particle group, whereby the mobile body enters an area that has been set as an area that the mobile body should not enter.

SUMMARY

According to an aspect of an embodiment, an estimating apparatus includes a processor configured to update a state of a first particle group indicating a state of a mobile body, from a current state to a next state through a simulation that is based on a state equation of the mobile body in a space using a particle filter; measure at each update, a distance between the mobile body and an object in the space; generate at each update, a second particle group indicating a state of a specific area in the space; calculate a level of likelihood for each particle of the first particle group and for each particle of the second particle group, based on the measured distance, the updated first particle group, and the generated second particle group; and identify a position of the mobile body in the space, based on the level of likelihood calculated for each particle.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is an explanatory diagram of an example of the contents of a dangerous area table of the estimating apparatus 200;

FIG. 5 is an explanatory diagram of an example of the contents of a particle table of the estimating apparatus 200;

FIG. 6 is an explanatory diagram of an example of the contents of an anxiety particle table of the estimating apparatus 200;

FIG. 7 is an explanatory diagram of an example of the contents of a sensor information table of the estimating apparatus 200;

FIG. 8 is an explanatory diagram of an example of the contents of a likelihood level table of the estimating apparatus 200;

FIG. 9 is a block diagram of a functional configuration of the estimating apparatus 200;

FIG. 11 is an explanatory diagram of the first operation example of the estimating apparatus 200 according to the first embodiment;

FIG. 12 is an explanatory diagram of the first operation example of the estimating apparatus 200 according to the first embodiment;

FIG. 17 is a flowchart of the contents of the anxiety particle generating process (step S1304) in the third operating example of the first embodiment;

FIG. 18 is a flowchart of the contents of the anxiety particle generating process (step S1304) in a fourth operation example of the first embodiment;

FIG. 21 is a flowchart of the contents of the operating control process by the estimating apparatus 200 in a first operating example of the second embodiment;

FIG. 24 is an explanatory diagram of a third operation example of the estimating apparatus 200 according to the second embodiment;

FIG. 25 is a flowchart of the contents of the anxiety particle generating process (step S2104) in the third operating example of the second embodiment; and FIG. 26 is a flowchart of the contents of the anxiety particle generating process (step S2104) in a fourth operation example of the second embodiment.

DESCRIPTION OF EMBODIMENTS

With reference to the accompanying drawings, preferred embodiments of an estimating apparatus, an estimating method, and an estimating program according to the present invention will be described in detail.

Figure 1A:
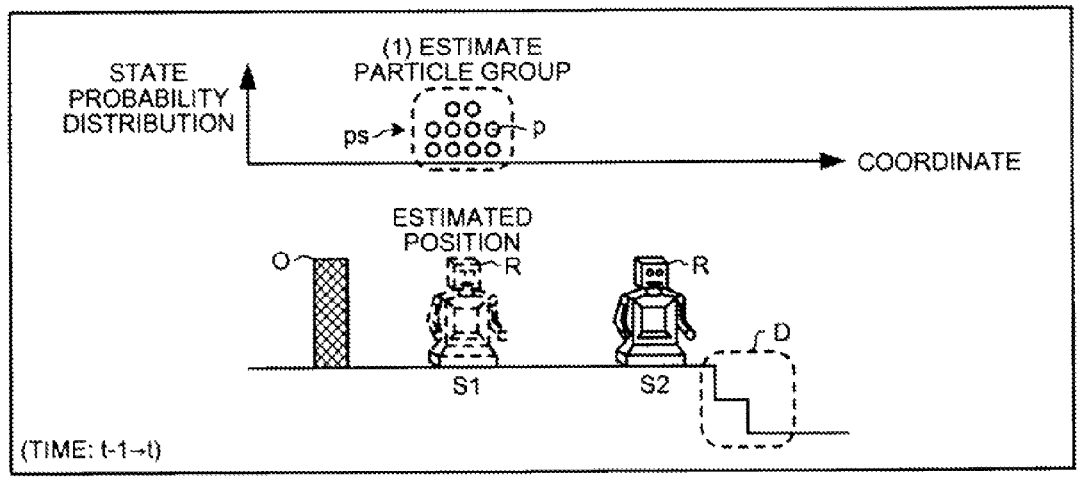
FIGS. 1A, 1B, and 1C are explanatory diagrams of the contents of position estimation concerning a mobile body by an estimating apparatus according to an embodiment.
Figure 1B:
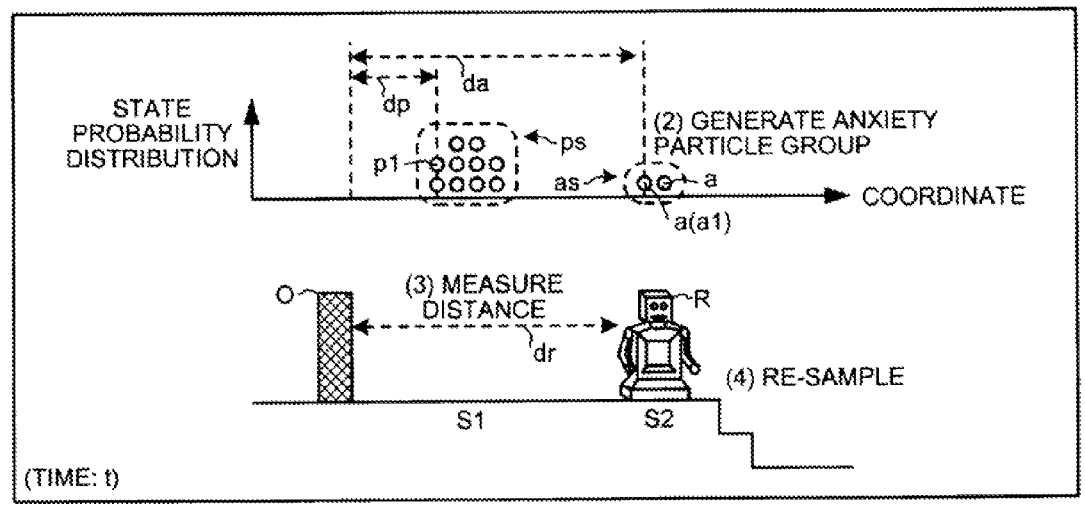
Figure 1C:
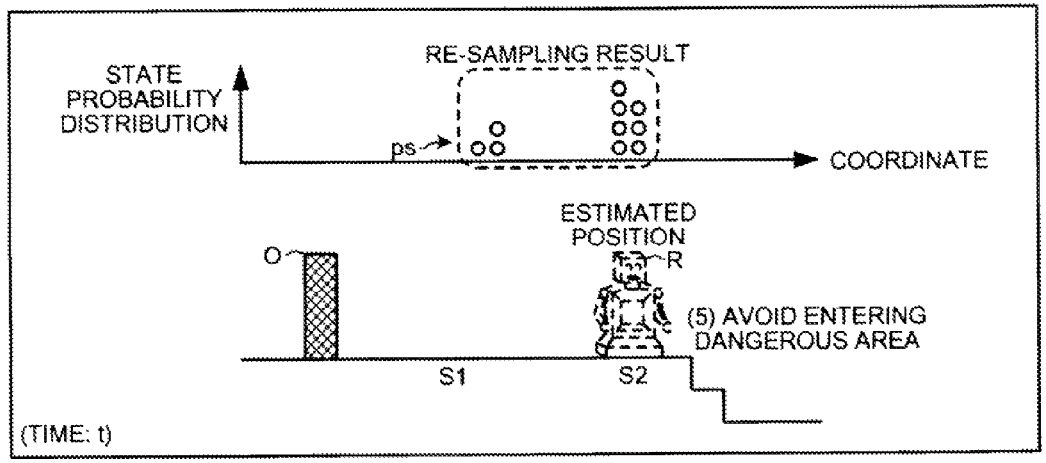

FIGS. 1A, 1B, 1C are explanatory diagrams of the contents of position estimation concerning a mobile body by the estimating apparatus according to an embodiment. FIGS. 1A, 1B, 1C depict an example of position estimation concerning the mobile body in a case where the mobile body is the estimating apparatus. For example, a case where an autonomous mobile robot R (hereinafter, "robot R") is adopted as the estimating apparatus will be described.

The robot R has position information concerning a dangerous area D and an obstacle O present in an area in which the robot R moves. The robot R estimates the state of the robot R by simulation using a particle group (ps) that is a set of particles (p) indicating a certain state of the robot R in the area in which the robot R moves. Based on the estimated state and the position information concerning the dangerous area D and the obstacle O, the robot R moves while avoiding the dangerous area D. The state of the robot R means, for example, the position, speed, and direction of travel of the robot R.

In FIG. 1A, (1) the robot R estimates a particle group (ps) indicating the state of the robot R at the current time "t" from a particle group (ps) indicating the state of the robot R at a past time "t−1", by simulation using a particle filter. The robot R then estimates the position of the robot R at the current time "t" to be a position S1, based on the estimated particle group (ps) indicating the state of the robot R at the current time "t".

However, the true position of the robot R is a position S2 in an area near the dangerous area D, which means that the robot R has estimated the position erroneously. One reason for erroneous position estimation by the robot R is, for example, the robot R is forcibly moved by a person (i.e., "kidnapped robot problem"). Another reason for erroneous position estimation by the robot R is, for example, wheels used by the robot R to move run idle or the orientation of the robot R changes upon collision with an object.

Still another reason for erroneous position estimation by the robot R is, for example, that an error between position information concerning the obstacle O and the actual position of the obstacle O and a calculation error made in a simulation grow in number as the simulation is repeated. Still another reason for erroneous position estimation by the robot R is, for example, that approximation of a probability distribution of the state of mobile body is insufficient because the number of particles (p) making up the particle group (ps) is small.

In FIG. 1B, (2) the robot R generates an anxiety particle group (as), in addition to the particle group (ps) indicating the state of the robot R at the current time "t". The anxiety particle group (as) is a set of anxiety particles (a) indicating a certain state of the robot R in an area near the dangerous area D based on position information concerning the dangerous area D.

(3) The robot R measures the distance from the position of the robot R to the obstacle O, using a distance sensor.

(4) The robot R calculates the distance from the robot R to the obstacle O, based on the position of the obstacle O and the position of the robot R indicated by each particle of the particle group (ps) and of the anxiety particle group (as). Based on the measured distance from the position of the robot R to the obstacle O and the calculated distance from the position of the robot R indicated by each particle to the obstacle O, the robot R carries out re-sampling of the group (ps) indicating the state of the robot R at the current time "t".

This re-sampling means preferentially selecting a particle that indicates a state having a high likelihood from among the particles of the particle group (ps) and the anxiety particle group (as), as a particle of the particle group (ps), to re-select the particle group (ps). In this process, the same particle may be selected several times. A state indicated by the re-selected particle group (ps) is re-estimated to be the state of the robot R at the current time "t".

In this example, the distance from the position of the robot R indicated by each particle (p) of the particle group (ps) to the obstacle O is shorter than the measured distance from the position of the robot R to the obstacle O. For example, the distance dp from the position of the robot R to the obstacle O indicated by a particle (p1) of the particle group (ps) is shorter than the measured distance dr from the position of the robot R to the obstacle O. For this reason, the robot R concludes that "the position of the robot R indicated by each particle (p) of the particle group (ps) is widely different from the actual position of the robot R", thus determining that the level of likelihood is low.

In contrast, the distance from each particle (a) of the anxiety particle group (as) to the obstacle O, which is depicted in FIG. 1B, is nearly the same as the measured distance from the position of the robot R to the obstacle O. For example, the distance (da) from the position of a particle (a1) of the anxiety particle group (as) to the obstacle O is nearly the same as the measured distance dr from the position of the robot R to the obstacle O. For this reason, the robot R concludes that "the position of the robot R indicated by each particle (a) of the anxiety particle group (as) is close to the actual position of the robot R" and thus, determines that the level of likelihood is high.

The robot R preferentially re-reselects each particle (a) of the anxiety particle group (as) having a higher level of likelihood than each particle (p) of the particle group (ps), as a particle (p) of the particle group (ps). The robot R re-estimates the state of the robot R at the current time "t", based the reselected particle group (ps).

In FIG. 1C, (5) the robot R estimates the position of the robot R at the current time "t" to be the position S2, based on the state of the robot R at the current time "t" re-estimated from a sampling result. Based on position information concerning the dangerous area D, the robot R determines that the position S2 as the estimated position is included in an area near the dangerous area D. Hence, the robot R moves away from the dangerous area D to avoid entering the dangerous area D.

In this manner, when the true position of the robot R is in an area near the dangerous area D, the robot R re-selects the anxiety particle (p) having a high level of likelihood as the particle (p) of the particle group (ps). The robot R thus improves the accuracy of position estimation. As a result, when estimating the position to be in an area near the dangerous area D, the robot R moves away from the dangerous area D to avoid entering the dangerous area D.

An example of a hardware configuration of the estimating apparatus will be described with reference to FIG. 2.

Figure 2:
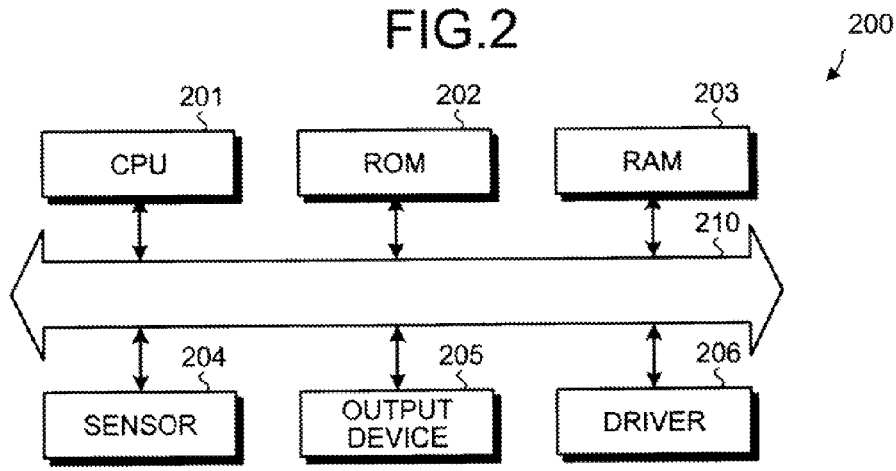
FIG. 2 is a block diagram depicting a hardware configuration of the estimating apparatus of the embodiment.

FIG. 2 is a block diagram depicting a hardware configuration of the estimating apparatus of the embodiment. In FIG. 2, the estimating apparatus 200 includes a central processing unit (CPU) 201, read-only memory (ROM) 202, random access memory (RAM) 203, a sensor 204, an output device 205, and a driver 206, respectively connected via a bus 210.

The CPU 201 carries out overall control over the estimating apparatus 200. The ROM 202 stores programs, such as a boot program. The ROM 203 is used as a work area of the CPU 201.

The sensor 204 transmits/receives electromagnetic waves, and converts a received electromagnetic wave into an electrical signal and stores the electrical signal to the RAM 203. For example, a distance sensor, such as an infrared light-receiving element, may be adopted as the sensor 204. The sensor 204 converts an optical image into an electrical signal and stores the electrical signal in the ROM 203. For example, an optoelectronic element capable of converting an optical image into an electrical signal, such as charge coupled device (CCD) and complementary metal-oxide semiconductor (CMOS) sensor, may be adopted as the sensor 204.

The output device 205 outputs data. For example, a display, speaker, etc., may be used as the output device 205. The driver 206, under the control of the CPU 201, drives the estimating apparatus 200. For example, a motor, engine, brake, etc., may be used as the driver 206. The estimating apparatus 200 is implemented as, for example, the autonomous mobile robot R that moves while estimating the position of the robot R, a vehicle that travels while estimating the position of another vehicle nearby, etc.

An example of the contents of an object table of the estimating apparatus 200 will be described with reference to FIG. 3. The object table stores the shape and position of objects in an area in which the mobile body moves. An object is provided as, for example, the obstacle O depicted in FIG. 1, a wall, etc. The object table is implemented by, for example, the RAM 203 depicted in FIG. 2.

Figure 3:
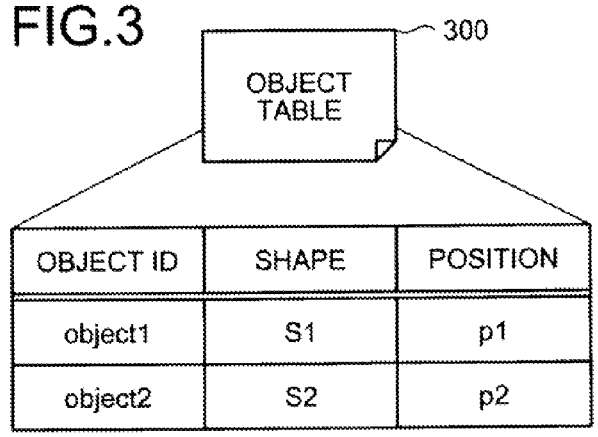
FIG. 3 is an explanatory diagram of an example of the contents of an object table of an estimating apparatus 200.

FIG. 3 is an explanatory diagram of an example of the contents of the object table of the estimating apparatus 200. As depicted in FIG. 3, the object table 300 has a shape field and a position field correlated with each object ID field, forming a record for each object.

The object ID field stores an identifier identifying the object in the area in which the mobile body moves. The shape field stores the shape of the object identified by the contents of the object ID field. For example, the shape field stores a type flag indicative of the type-dependent shape of the object and a value identifying the type-dependent shape of the object. For example, the shape field stores a type flag indicative of the cuboid shape of the object and the depth, the width, and the height of the cuboid. The shape field may store therein a type flag indicative of a columnar shape of the object and the position of the center of the column's bottom face, the radius of the column's bottom face, and the column's height.

The position field stores the position of the object identified by the contents of the object ID field. For example, the position field stores coordinate values indicative of the position of the object (e.g., an x coordinate value, a y coordinate value, and a z coordinate value in a three-dimensional space). The position field may store the orientation of the object (e.g., an angle with respect to the x axis, an angle with respect to the y axis, and an angle with respect to the z axis in a three-dimensional space).

An example of the contents of a dangerous area table of the estimating apparatus 200 will be described with reference to FIG. 4. The dangerous area table stores areas near an area (dangerous area D) defined as areas that the moving object should not enter. The dangerous area table is implemented by, for example, the RAM 203 depicted in FIG. 2.

FIG. 4 is an explanatory diagram of an example of the contents of the dangerous area table of the estimating apparatus 200. As depicted in FIG. 4, the dangerous area table 400 has a neighboring area field and an anxiety particle ID list field correlated with each area ID field, forming a record for each dangerous area D.

The area ID field has an identifier identifying an area (dangerous area D) defined as an area that the mobile body should not enter. The neighboring area field stores information identifying a range of an area near the dangerous area D identified by the contents of the area ID field. For example, the neighboring area field stores the coordinate values of two apexes not sharing a side if the neighboring area is of a rectangular shape. The anxiety particle ID list field stores an identifier identifying the anxiety particle (a) indicating a certain state of the mobile body.

An example of the contents of a particle table of the estimating apparatus 200 will be described with reference to FIG. 5. The particle table stores the particles (p) indicating the estimated position of the mobile body. The particle table is implemented by, for example, the RAM 203 depicted in FIG. 2.

FIG. 5 is an explanatory diagram of an example of the contents of the particle table of the estimating apparatus 200. As depicted in FIG. 5, the particle table 500 has variable fields (variable 1 field to variable k field in FIG. 5) correlated with each particle ID field, forming a record for each particle (p).

The particle ID field stores an identifier identifying the particle (p) indicating a certain state which the mobile body may enter. The variable field stores the value of a variable identifying the state of a particle (p) identified by the contents of the particle ID field. As depicted in FIG. 5, the particle table may have multiple variable fields or one variable field.

For example, the variable field stores coordinate values indicative of the position of the particle (p) identified by the contents of the particle ID field. For example, the variable field stores an x coordinate value, a y coordinate value, and a z coordinate value for a three-dimensional space.

The variable field also stores, for example, the speed of the particle (p) identified by the contents of the particle ID field. The unit of the speed is, for example, "m/s (meter/second)". The variable field also stores, for example, the direction of travel of the particle (p) identified by the contents of the particle ID field. For example, the variable field stores an angle of the direction of travel of the particle (p) when north is defined as 0 degrees in an area in which the mobile body moves. The unit of the angle of the direction of travel is, for example, "degree".

An example of the contents of an anxiety particle table of the estimating apparatus 200 will be described with reference to FIG. 6. The anxiety particle table stores the anxiety particles (a) indicating the state of an area near the dangerous area D. The anxiety particle table is implemented by, for example, the RAM 203 depicted in FIG. 2.

FIG. 6 is an explanatory diagram of an example of the contents of the anxiety particle table of the estimating apparatus 200. As depicted in FIG. 6, the anxiety particle table 600 has variable fields (variable 1 field to variable k field in FIG. 6) correlated with each anxiety particle ID field, forming a record for each anxiety particle (a).

The anxiety particle ID field stores an identifier identifying the anxiety particle (a) indicating a certain state that the mobile body may enter in an area near the dangerous area D. The variable field stores the value of a variable identifying the state of the anxiety particle (a) identified by the contents of the anxiety particle ID field. As depicted in FIG. 6, the anxiety particle table may have multiple variable fields or one variable field.

For example, the variable field stores coordinate values indicative of the position of the anxiety particle (a) identified by the contents of the anxiety particle ID field. For example, the variable field stores an x coordinate value, a y coordinate value, and a z coordinate value for a three-dimensional space.

The variable field also stores, for example, the speed of the anxiety particle (a) identified by the contents of the anxiety particle ID field. The unit of the speed is, for example, "m/s (meter/second)". The variable field also stores, for example, the direction of travel of the anxiety particle (a) identified by the contents of the anxiety particle ID field. For example, the variable field stores an angle of the direction of travel of the anxiety particle (a) when north defined as 0 degrees in an area in which the mobile body moves.

An example of the contents of a sensor information table of the estimating apparatus 200 will be described with reference to FIG. 7. The sensor information table stores measurements taken by the sensor the estimating apparatus 200. The sensor information table is implemented by, for example, the RAM 203 depicted in FIG. 2.

FIG. 7 is an explanatory diagram of an example of the contents of the sensor information table of the estimating apparatus 200. As depicted in FIG. 7, the sensor information table 700 has measurement fields (measurement 1 field to measurement M field in FIG. 7) correlated with each time field, forming a record for each time at which the sensor 204 takes a measurement.

The time field stores the time at which a measurement is taken by the sensor 204. The measurement field stores a value that is a measurement taken by the sensor 204 at a time indicated in the time field. As depicted in FIG. 7, the sensor information table may have a multiple measurement fields or one measurement field. For example, the sensor information table may include a measurement field storing the distances to obstacles O located in front of, in back of, on the left of, and on the right of the mobile body.

For example, the measurement field stores the distance from the mobile body to the obstacle O, measured by the distance sensor. The unit of the measurement field is, for example, "m (meter)".

An example of the contents of a likelihood level table of the estimating apparatus 200 will be described with reference to FIG. 8. The likelihood level table stores a level of likelihood for each particle of the particle group (ps) and of the anxiety particle group (as), calculated by the estimating apparatus 200. The likelihood level table is implemented by, for example, the RAM 203 depicted in FIG. 2.

FIG. 8 is an explanatory diagram of an example of the contents of the likelihood level table of the estimating apparatus 200. As depicted in FIG. 8, the likelihood level table 800 has a likelihood level field correlated with each particle ID field, forming a record for each particle (p). The likelihood level table 800 is updated each time the state of the mobile body is estimated.

The particle ID field stores an identifier identifying a particle of the particle group (ps) and of the anxiety particle group (as). The likelihood level field stores a level of likelihood indicative of the likelihood of the state of the mobile body indicated by a particle identified by the contents of the particle ID field.

An example of a functional configuration of the estimating apparatus 200 will be described with reference to FIG. 9.

FIG. 9 is a block diagram of a functional configuration of the estimating apparatus 200. The estimating apparatus 200 includes an updating unit 901, a measuring unit 902, a generating unit 903, a calculating unit 904, a determining unit 905, a setting unit 906, an identifying unit 907, a judging unit 908, and a control unit 909.

The updating unit 901 updates the state of a first particle group that indicates the state of the mobile body, from the current state to the next state through a simulation based on a state equation of the mobile body in a space, using a particle filter. The space refers to an area in which the mobile body moves. For example, when the mobile body is the robot R, the space refers to a room or building in which the robot R moves. When the mobile body is a vehicle, the space refers to a road. The state equation is an equation that when given a past state of the mobile body, determines the current state of the mobile body.

For example, the state equation is a motion equation that when given the position and speed of the mobile body at a time "t−1", determines the position and speed of the mobile body at a time "t". The state equation is equivalent to equations (2) and (5) that will be described later. The first particle group indicating the state of the mobile body is the particle group (ps) that approximates a probability distribution of the state of the mobile body. One particle of the particle group (ps) indicates a certain state that the mobile body may enter.

For example, the updating unit 901 gives the state of each particle (p) of the particle group (ps) indicating the state of the mobile body right before the current time, each particle (p) being stored in the particle table 500, to the state equation to calculate the state of each particle (p) at the current time. The updating unit 901 then updates the particle table 500 with the calculated state of each particle (p) at the current time.

Through this process, the updating unit 901 is able to estimate the current state of the mobile body from the past state of the mobile body. For example, a function of the updating unit 901 is implemented by, for example, causing the CPU 201 to execute a program stored in a storage device, such as the ROM 202 and RAM 203 depicted in FIG. 2.

The measuring unit 902 measures the distance between the mobile body and an object in the space each time the updating unit 901 carries out the updating. The distance between the mobile body and the object in the space is, for example, equivalent to the distance from the estimating apparatus 200 to the object (obstacle O or wall) in the space when the mobile body is the estimating apparatus 200 itself. The distance between the mobile body and the object in the space is, for example, the distance from the mobile body to the object (estimating apparatus 200 itself) in the space when the mobile body is not the estimating apparatus 200. For example, the measuring unit 902 measures the distance between the mobile body and the object in the space by the sensor 204 each time the updating unit 901 carries out the updating.

Through this process, the measuring unit 902 is able to obtain the distance from the mobile body to the object in the space, and the distance is used by the calculating unit 904 to calculate the level of likelihood for each particle. For example, a function of the measuring unit 902 is implemented by, for example, causing the CPU 201 to execute a program stored in a storage device, such as the ROM 202 and RAM 203 depicted in FIG. 2, or by the sensor 204.

The generating unit 903 generates a second particle group indicating the state of a specific area in the space each time the updating unit 901 carries out the updating. The specific area refers to an area near a predetermined restricted area that the mobile body should not enter. The restricted area is, for example, the dangerous area D. The neighboring area refers to an area around the restricted area. The ranges of the restricted area and neighboring area are set arbitrarily. The second particle group indicates the state of the mobile body to be in an area near the dangerous area D. The second particle group is, for example, the anxiety particle group (as). For example, the generating unit 903 reads the state of the mobile body indicated by the anxiety particle (a) (e.g., position, speed, and direction of travel of the mobile body) from the anxiety particle table 600, and generates the anxiety particle group (as).

In this manner, the generating unit 903 generates the anxiety particle (a) in an area near the dangerous area D, so that when the identifying unit 907 identifies the position of the mobile body, if the true position of the mobile body is in an area near the dangerous area, the identifying unit 907 is able to identify the position of the mobile body to be in an area near the dangerous area. For example, a function of the generating unit 903 is implemented by, for example, causing the CPU 201 to execute a program stored in a storage device, such as the ROM 202 and RAM 203 depicted in FIG. 2

The calculating unit 904 calculates a level of likelihood for each particle of the first and second particle groups based on the distance measured by the measuring unit 902, the first particle group updated by the updating unit 901, and the second particle group generated by the generating unit 903. This level of likelihood is a value indicative of the likelihood of the state of mobile body indicated by a particle. For example, in a normal distribution with an expected value being a measurement obtained by measuring in the actual state of the mobile body, a probability that the expected value becomes equal to a measurement estimated from the state of the mobile body indicated by each particle may be adopted as a level of likelihood.

For example, the calculating unit 904 calculates the distance from the position of the mobile body indicated by each particle (p) of the particle group (ps) to the object in the space, from the state of the mobile body indicated by each particle (p) of the particle group (ps) updated by the updating unit 901. The calculating unit 904 further calculates the distance from the position of the mobile body indicated by each particle (a) of the anxiety particle group (as) to the object in the space, from the state of the mobile body indicated by each particle (a) of the anxiety particle group (as) generated by the generating unit 903.

Subsequently, in a normal distribution with an expected value being the distance from the mobile body to the object in the space measured by the measuring unit 902, the calculating unit 904 calculates probabilities that the expected value becomes equal to the distance from the position of the mobile body indicated by each particle of the particle group (ps) to the object in the space and to the distance from the position of the mobile body indicated by each particle of the anxiety particle group (as) to the same. The calculating unit 904 determines each of the calculated probabilities to be a level of likelihood for each particle and updates the likelihood level table 800 with the level of likelihood.

When the distances to multiple objects are measured by the measuring unit 902, the calculating unit 904 calculates each probability that the expected value becomes equal to the distance from the position of the mobile body indicated by each particle of the particle group (ps) and of the anxiety particle group (as) to each of the objects. The calculating unit 904 determines an infinite product of probabilities each calculated for each object to be a level of likelihood of each particle and updates the likelihood level table 800 with the determined level of likelihood.

In this manner, the calculating unit 904 is able to calculate a level of likelihood for each particle (p) of the particle group (ps) and for each particle (a) of the anxiety particle group (as). For example, a function of the calculating unit 904 is implemented by, for example, causing the CPU 201 to execute a program stored in a storage device, such as the ROM 202 and RAM 203 depicted in FIG. 2.

The determining unit 905 determines if a level of likelihood calculated by the calculating unit 904 the last time is equal to or larger than a threshold. The threshold is a value that is preset by a user of the estimating apparatus 200. When a probability in a normal distribution is adopted for calculation of the level of likelihood, an adopted threshold is defined, for example, as the "probability that the expected value±standard deviation is equal to the measurement". For example, the determining unit 905 determines if the level of likelihood for each particle (p) of the particle group (ps) calculated by the calculating unit 904 the last time is equal to or larger than a threshold, and when finding a particle (p) having a level of likelihood equal to or larger than the threshold, stores the time and the state of the particle (p) having the level of likelihood equal to or larger than the threshold to a memory area, such as RAM 203.

Further, configuration may be such that the determining unit 905 determines if the sum of the likelihood levels of respective particles (p) of the particle group (ps) calculated by the calculating unit 904 the last time is equal to or larger than a threshold, and if the sum of the likelihood levels is equal to or larger than the threshold, stores the time and the state of respective particles (p) to a memory area, such as RAM 203. In this manner, the determining unit 905 is able to store the state of the mobile body estimated with high accuracy with a level of likelihood equal to or higher than the threshold.

In this case, when the determining unit 905 determines that a level of likelihood calculated the last time to be equal to or higher than the threshold, the generating unit 903 stops generating the second particle group. For example, when the determining unit 905 determines that the level of likelihood of any particle (p) of the particle group (ps) indicating the state of the mobile body at the last time to be equal to or higher than the threshold, the generating unit 903 does not read the state of the mobile body indicated by the anxiety particle (a) (e.g., position, velocity, and direction of travel of the mobile body) from the anxiety particle table 600. This also applies to a case where the sum of the likelihood levels of respective particles (p) of the particle group (ps) calculated the last time is equal to or larger than the threshold.

In this manner, when the accuracy of estimation of the state of the mobile body is high, the generating unit 903 does not generate the anxiety particle (a), and thereby reduces the volume of processing. When the accuracy of estimation of the state of the mobile body is low, the generating unit 903 generates the anxiety particle (a). As a result, when the true position of the mobile body is in an area near the dangerous area D, the identifying unit 907 is able to identify the position of the mobile body to be in an area near the dangerous area D.

For example, a function of the determining unit 905 is implemented by, for example, causing the CPU 201 to execute a program stored in a storage device, such as the ROM 202 and RAM 203 depicted in FIG. 2.

The setting unit 906 sets a movement range for the mobile body, based on the position of the mobile body in the space at a point of in time when the level of likelihood has been determined to be equal to or higher than the threshold by the determining unit 905. For example, the setting unit 906 calculates the range in which the mobile body can move until the current time, based on the estimated position of the mobile body at the point of in time when the level of likelihood is determined to be equal to or higher than the threshold by the determining unit 905 and on the speed of movement of the mobile body until the current time. The setting unit 906 then stores the calculated range in which the mobile body can move to a memory area, such as the RAM 203. In this manner, the setting unit 906 is able to set the range in which the mobile body can move.

In this case, the generating unit 903 generates the second particle group in one of the neighboring areas that overlaps the movement range set by the setting unit 906. From among the records in the dangerous area table 400, the generating unit 903 identifies a record in which the range of the neighboring area identified by information concerning the neighboring area field overlaps the movement range of the mobile body set by the setting unit 906. The generating unit 903 then refers to the anxiety ID list of the identified record and reads the state of the mobile body indicated by the anxiety particle (a) (e.g., position, velocity, and direction of travel of the mobile body) from the anxiety particle table 600.

As a result, the generating unit 903 does not generate the anxiety particle (a) in a neighboring area that does not overlap the movement range of the mobile body, and thereby reduces the volume of processing. The generating unit 903 generates the anxiety particle (a) in a neighboring area that overlaps the movement range of the mobile body. Thus, when the identifying unit 907 identifies the position of the mobile body, the identifying unit 907 is able to identify the position of the mobile body to be in an area near the dangerous area D.

For example, a function of the setting unit 906 is implemented by, for example, causing the CPU 201 to execute a program stored in a storage device, such as the ROM 202 and RAM 203 depicted in FIG. 2.

The identifying unit 907 identifies the position of the mobile body in a space, based on the level of likelihood of each particle calculated by the calculating unit 904. For example, the identifying unit 907 re-selects the particle (p) of the particle group (ps) from among particles according to a probability proportional to the level of likelihood calculated by the calculating unit 904 for each particle.

For example, the identifying unit 907 divides a section [0, 1] into subsections, each having a length proportional to the level of likelihood of each particle and associates each particle with each subsection corresponding thereto in terms of length. The identifying unit 907 generates uniform random numbers of [0, 1], and re-selects a particle that corresponds to a subsection in which a random number is placed, as the particle (p) of the particle group (ps). One particle may be selected several times as the particle (p) of the particle group (ps). Hence, the identifying unit 907 identifies the current position of the mobile body based on the state of the mobile body indicated by the re-sampled particle group (ps).

In this manner, the identifying unit 907 is able to identify the position of the mobile body. For example, a function of the identifying unit 907 is implemented by, for example, causing the CPU 201 to execute a program stored in a storage device, such as the ROM 202 and RAM 203 depicted in FIG. 2.

The judging unit 908 judges whether the position of the mobile body identified by the identifying unit 907 is in a specific area. For example, the judging unit 908 judges whether the position of the mobile body identified by the identifying unit 907 is in the range of a neighboring area identified from the contents of the neighboring area field of the dangerous area table 400, and stores the result of the judgment in a memory area, such as RAM 203.

In this manner, the judging unit 908 is able to judge whether the mobile body is in an area near the dangerous area D. For example, a function of the judging unit 908 is implemented by, for example, causing the CPU 201 to execute a program stored in a storage device, such as the ROM 202 and RAM 203 depicted FIG. 2.

When the judging unit 908 judges that the mobile body is situated in the specific area, the control unit 909 carries out control to cause the mobile body to move away from the specific area. For example, when the judging unit 908 judges that the mobile body is situated in an area near the dangerous area D, the control unit 908 refers to the dangerous area table 400 and controls the driver 206 so as to cause the mobile body to move away from the specific area.

For example, the control unit 909 determines whether the dangerous area D lies ahead in the direction of travel of the mobile body, based on the range of the neighboring area identified from the contents of the neighboring area field of the dangerous area table 400 and on the position and direction of travel of the mobile body indicated by the particle group (ps). If the dangerous area D lies ahead in the direction of travel of the mobile body, the control unit 909 controls the driver 206 so that the direction of travel of the mobile body is reversed.

In this manner, the control unit 909 is able to keep the mobile body from entering the dangerous area D. For example, a function of the judging unit 905 is implemented by causing the CPU 201 to execute a program stored in a storage device, such as the ROM 202 and RAM 203 depicted in FIG. 2.

A first embodiment will be described. The first embodiment is an example of estimation of the position of the mobile body in a case where the mobile body is the estimating apparatus 200 itself. For example, a case of adopting the autonomous mobile robot R (hereinafter "robot R") as the estimating apparatus 200 (mobile body) will be described.

A first operation example of the estimating apparatus 200 according to the first embodiment will be described with reference to FIGS. 10A to 12. The robot R has the object table 300 and the dangerous area table 400. The robot R estimates the state of the robot R by simulation using the particle group (ps) that is a set of particles p each indicating a certain state of the robot R in an area in which the robot R moves. Based on the object table 300, the dangerous area table 400, and the estimated state of the robot R, the robot R estimates the position of the robot R in the dangerous area D and in an area in which the obstacle O is present and moves while avoiding the dangerous area D.

Figure 10A:
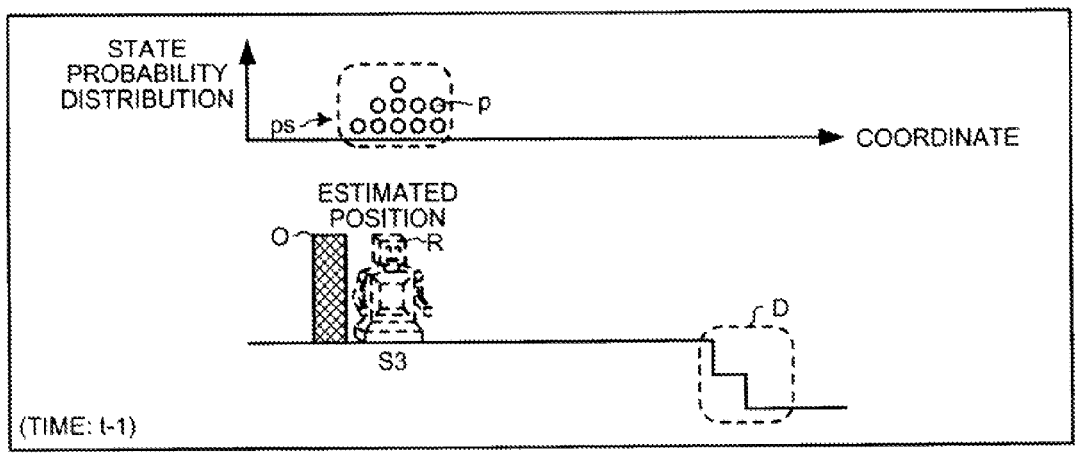
FIGS. 10A and 10B are explanatory diagrams of a first operation example of the estimating apparatus 200 according to a first embodiment.

FIGS. 10A to 12 are explanatory diagrams of the first operation example of the estimating apparatus 200 according to the first embodiment. In FIG. 10A, the robot R estimates the position of the robot R at a time "t−1" to be a position S3, from a particle group (ps) indicating a state $X_{t-1}$ of the mobile body at the time "t−1". The state $X_t$ of the mobile body is represented by equation (1), where x denotes the position of the mobile body and v(x) denotes the speed of the mobile body.

$$x_t = \begin{bmatrix} x \\ v(x) \end{bmatrix} \quad (1)$$

Figure 10B:
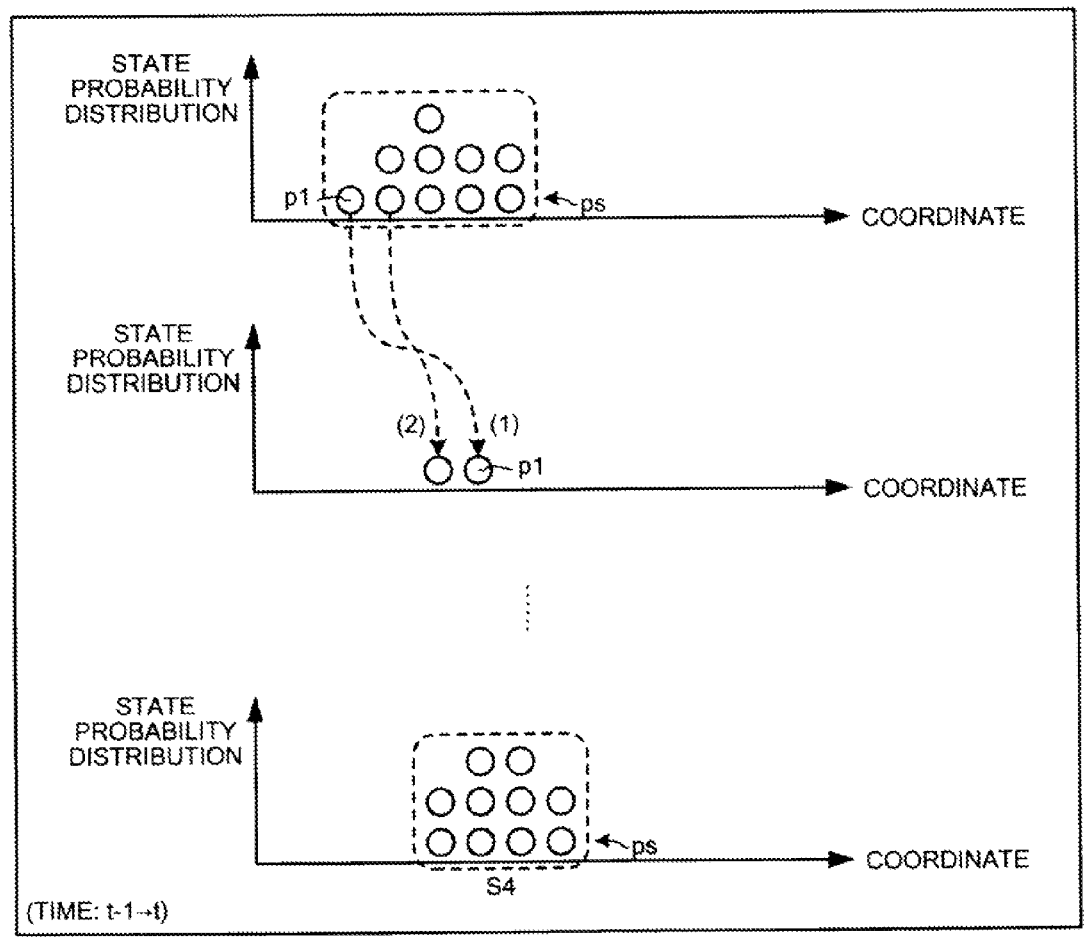

In FIG. 10B, the robot R carries out simulation using a particle filter to estimate a particle group (ps) indicating the state of the mobile body $X_t$ at the current time "t", from the particle group (ps) indicating the state $X_{t-1}$ of the mobile body at the time "t−1".

(1) For example, the robot R substitutes a state $X_{t-1}^{(1)}$ indicated by a particle (p1) of the particle group (ps) to state equation (2) to calculate the current state $X_t^{(1)}$ of the particle p1. In equation (2), i denotes a number assigned to each particle for convenience, $\eta_t^{(i)}$ denotes system noise, $\Delta T$ denotes a time step "(t)−(t−1)", and $a_t^{(i)}$ denotes the acceleration of the mobile body.

$$x_t = \begin{pmatrix} 1 & \Delta T \\ 0 & 1 \end{pmatrix} x_{t-1} + \begin{pmatrix} \frac{\Delta T^2}{2} \\ \Delta T \end{pmatrix} a_t + \eta_t \quad (2)$$

(2) In the same manner, the robot R also calculates the current state $X_t$ of other particles (p) of the particle group (ps). In this manner, the robot R is able to estimate the particle group (ps) indicating the state $X_t$ of the mobile body at the current time "t".

In FIG. 11, the robot R calculates the level of likelihood for each particle of the particle group (ps) estimated in FIGS. 10A, 10B indicating the state $X_t$ of the mobile body at the current time "t" and for each particle of the anxiety particle group (as) generated in an area near the dangerous area D indicating the state $X_t$ of the mobile body to be in an area near the dangerous area D. FIG. 11 depicts an example in which the level of likelihood of one particle (p1) and the level of likelihood of one particle (a1) are calculated.

(1) The estimating apparatus 200 refers to the object table 300 and calculates the distances from positions indicated by the particle (p1) and anxiety particle (a1) to an object in a space. For example, the estimating apparatus 200 calculates the distance from a position indicated by the particle to a wall in front, the distance from the same to a wall on the right, the distance from the same to a wall on the left, and the distance from the same to a wall in back, as the distances to the object in the space.

For example, the estimating apparatus 200 calculates the distance da_f from the position indicated by the particle (a1) to the wall in front, the distance da_r from the position indicated by the particle (a1) to the wall on the right, the distance da_l from the position indicated by the particle (a1) to the wall on the left, and the distance da_b from the position indicated by the particle (a1) to the wall in back. The estimating apparatus 200 also calculates the distance dp_f from the position indicated by the particle (p1) to the wall in front, the distance dp_r from the position indicated by the particle (p1) to the wall on the right, the distance dp_l from the position indicated by the particle (p1) to the wall on the left, and the distance dp_b from the position indicated by the particle (p1) to the wall in back.

(2) The estimating apparatus 200 then measures the distance from the actual position to the object using the sensor 204. For example, the estimating apparatus 200 calculates the distance dr_f from the estimating apparatus 200 to the wall in front, the distance dr_r from the estimating apparatus 200 to the wall on the right, distance dr_l from the estimating apparatus 200 to the wall on the left, and the distance dr_b from the estimating apparatus 200 to the wall in back, using four sensors 204. Although the estimating apparatus 200 measures the distance to each wall using the four sensors 204 in this example, configuration is not limited hereto. For example, the estimating apparatus 200 may measure the distance to each wall by changing the measuring direction of one sensor 204.

(3) The estimating apparatus 200 calculates likelihood (level of likelihood) through comparison between the distance from the position indicated by the particle (p1) to the each wall and the distance from the true position to each wall. For example, in a normal distribution with an expected value being the measured distance to each wall, the estimating apparatus 200 calculates an infinite product p of probabilities that the expected value becomes equal to the distance from the position indicated by the particle (p1) to each wall ($Y_t | X_{t|t-1}^{(i)}$), using equation (3), where $\Sigma_j$ denotes standard deviation, $y_{jt}$ denotes the distance to the wall measured by the sensor 204, $y_{jt}^{(i)}$ denotes the calculated distance to the wall, i denotes a number for the particle p, and j denotes a number for the sensor 204.

$$p(y_t | x_{t|t-1}^{(i)}) = p(y_t | y_t^{(i)}) = \prod_{j=1}^{k} \frac{1}{\sqrt{2\pi}\, \sigma_j} \exp\left(-\frac{(y_{jt} - y_{jt}^{(i)})^2}{2\sigma_j^2}\right) \quad (3)$$

The estimating apparatus 200 determines the calculated infinite product of probabilities to be the level of likelihood of the particle (p1). In FIG. 11, a wide difference exists between the distance from the position indicated by the particle (p1) to each wall and the distance from the true position to each wall. As a result, the level of likelihood of the particle (p1) is low.

(4) In the same manner as described in (3), the estimating apparatus 200 calculates likelihood (level of likelihood) through comparison between the distance from the anxiety particle (a1) to the each wall and the distance from the true position to each wall. For example, in a normal distribution with an expected value being the measured distance to each wall, the estimating apparatus 200 calculates an infinite product p of probabilities that the expected value becomes equal to the distance from the anxiety particle (a1) to each wall, using the equation (3). The estimating apparatus 200 determines the calculated infinite product of probabilities to be the level of likelihood of the anxiety particle (a1). In FIG. 11, the difference of the distance from the anxiety particle (a1) to each wall and the distance from the true position to each wall is small. As a result, the level of likelihood of the anxiety particle (a1) is high.

As depicted in FIG. 12, based on the level of likelihood for each particle of the particle group (ps) and of the anxiety particle group (as) calculated by the process described in FIG. 11, the robot R re-samples the particle group (ps) indicating the present position to identify the present position.

In the re-sampling, for example, the particle (p) of the particle group (ps) is re-selected from particles according to a probability proportional to the level of likelihood for each particle of the particle group (ps) and the level of likelihood for the anxiety particle group (as). At this time, the same particle may be selected several times. For example, the robot R divides a section [0, 1] into subsections for each particle in proportional to the level of likelihood for each particle, generates uniform random numbers of [0, 1] in the section [0, 1], and re-selects a particle (particle (p) or anxiety particle (a)) corresponding to a subsection in which a random number is placed, as the particle (p) of the particle group (ps).

As depicted in FIG. 12, if the true position of the robot R is in an area near a position S4 indicated by the particle group (ps) estimated in FIGS. 10A, 10B, the level of likelihood of each particle (p) of the particle group (ps) is high while the level of likelihood of each particle (a) of the anxiety particle group (as) is low. For this reason, in the re-sampling, the robot R preferentially re-selects each particle (p) of the particle group (ps) estimated in FIGS. 10A, 10B as a particle (p) of the particle group (ps) over each particle (a) of the anxiety particle group (as), and thereby re-estimates the particle group (ps). The robot R is, therefore, able to estimate the position S4 indicated by the re-estimated particle group (ps) to be the position. As a result, the robot R determines that the position is not in an area near the dangerous area D, and executes normal operation.

In contrast, if the true position of the robot R is not in an area near the position S4 indicated by the particle group (ps) estimated in FIGS. 10A, 10B but is in an area near the dangerous area D, the level of likelihood for each particle (p) of the particle group (ps) is low while the level of likelihood of each particle (a) of the anxiety particle group (as) is high. For this reason, in the re-sampling, the robot R preferentially re-selects each particle (a) of the anxiety particle group (as) as a particle (p) of the particle group (ps) over each particle (p) of the particle group (ps), and thereby re-estimates the particle group (ps). The robot R is, therefore, able to estimate a position S5 indicated by the re-estimated particle group (ps) to be the position. As a result, the robot R determines that the position is in an area near the dangerous area D, and moves in a direction away from the dangerous area D.

In this manner, by carrying out re-sampling using the anxiety particle group (as), the robot R selects the anxiety particle (a) as the particle (p) of the particle group (ps) to be re-estimated when the level of likelihood for each particle (a) of the anxiety particle group (as) is high. When the true position is in an area near the dangerous area D, the robot R selects the anxiety particle (a) having a high level of likelihood as the particle (p) of the particle group (ps), and thereby improves the accuracy of estimation of the position.

When the robot R carries out re-sampling using the anxiety particle group (as), however, if the position is not in an area near the dangerous area, the robot R does not select the anxiety particle (a) having a low level of likelihood as the particle (p) of the particle group (ps). The robot R, therefore, does not erroneously estimate the position to be in an area near the dangerous area. When estimating the position to be in an area near the dangerous area D, the robot R moves away from the dangerous area D to avoid entering the dangerous area D.

The contents of an operation control process by the estimating apparatus 200 in the first operation example of the estimating apparatus 200 according to the first embodiment will be described with reference to FIG. 13.

Figure 13:
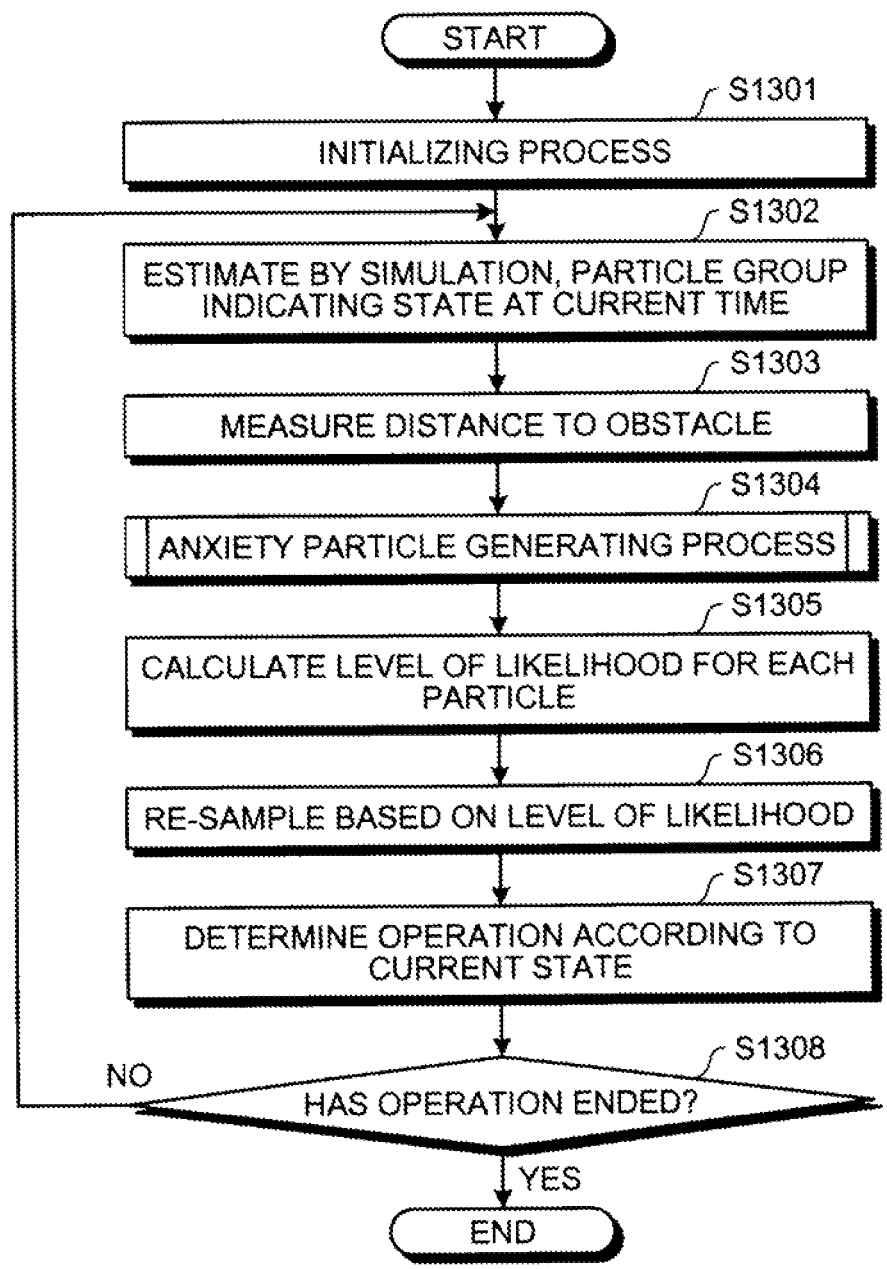
FIG. 13 is a flowchart of the contents of an operation control process by the estimating apparatus 200 in the first operation example of the first embodiment.

FIG. 13 is a flowchart of the contents of the operation control process by the estimating apparatus 200 in the first operation example of the first embodiment. The CPU 201 carries out an initializing process (step S1301). In the initializing process, the estimating apparatus 200 reads information concerning an object in a space from the object table 300 and information concerning the dangerous area D in the space from the dangerous area table 400, and generates particles (p) uniformly in the space.

The estimating apparatus 200 then carries out simulation using the particle filter to estimate a particle group (ps) indicating the state of the mobile body at the current time from a particle group (ps) indicating the state of the mobile body right before the current time (step S1302). The process at step S1302 corresponds to the process by the estimating apparatus 200 depicted in FIGS. 10A, 10B.

The estimating apparatus 200 measures the distance from the estimating apparatus 200 to the obstacle O using the sensor 204 (step S1303). Subsequently, the CPU 201 executes an anxiety particle generating process (step S1304).

In the anxiety particle generating process, the estimating apparatus 200 identifies an anxiety particle ID from the contents of the anxiety particle ID field in a record of the dangerous area table 400, and generates anxiety particles (a) corresponding to the anxiety particle ID, based on the anxiety particle table 600.

The estimating apparatus 200 then calculates a level of likelihood for each particle of the particle group (ps) estimated at step S1302 and for each particle of the anxiety particle group (as) estimated at step S1304 (step S1305). The processes at steps S1303 to S1305 correspond to the process by the estimating apparatus 200 depicted in FIG. 11.

The estimating apparatus 200 carries out re-sampling of the particle group (ps) generated at step S1302, based on the level of likelihood for each particle calculated at step S1305, and identifies the current state of the mobile body (step S1306). The estimating apparatus 200 then determines an operation according to the identified current state of the mobile body (step S1307). The processes at steps S1306 and S1307 correspond to the process by the estimating apparatus 200 depicted in FIG. 12.

Subsequently, the estimating apparatus 200 determines whether the operation has ended (step S1308). Ending of the operation means the robot R has reached a given destination or the current time is a prescribed time. If the operation has not ended (step S1308: NO), the CPU 201 returns to step S1302.

If the operation has ended (step S1308: YES), the estimating apparatus 200 ends the operation control process. In this manner, the estimating apparatus 200 (mobile body) estimates the position thereof and moves while avoiding the dangerous area D.

A second operation example of the estimating apparatus 200 according to the first embodiment will be described with reference to FIGS. 14A, 14B, 14C.

Figure 14A:
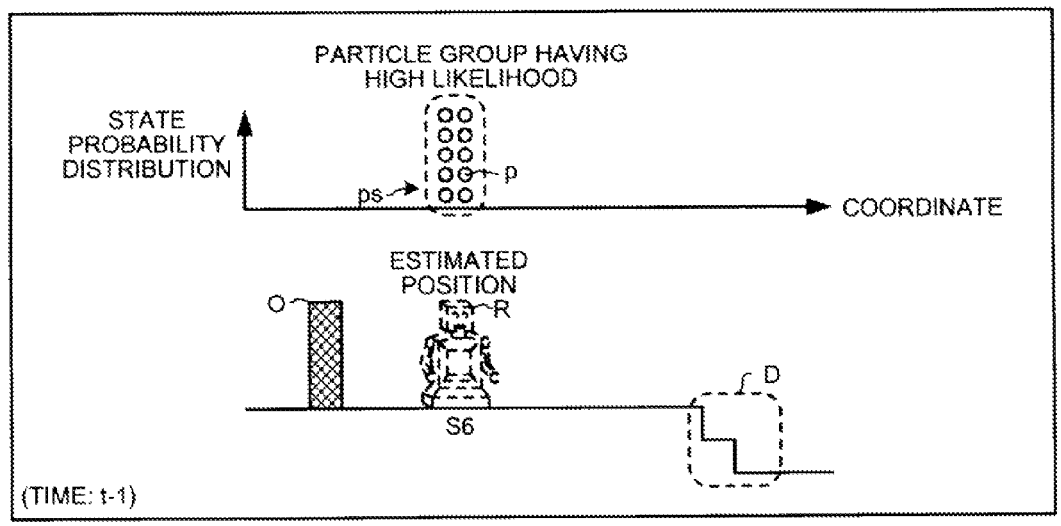
FIGS. 14A, 14B, 14C are explanatory diagrams of a second operation example of the estimating apparatus 200 according to the first embodiment.
Figure 14B:
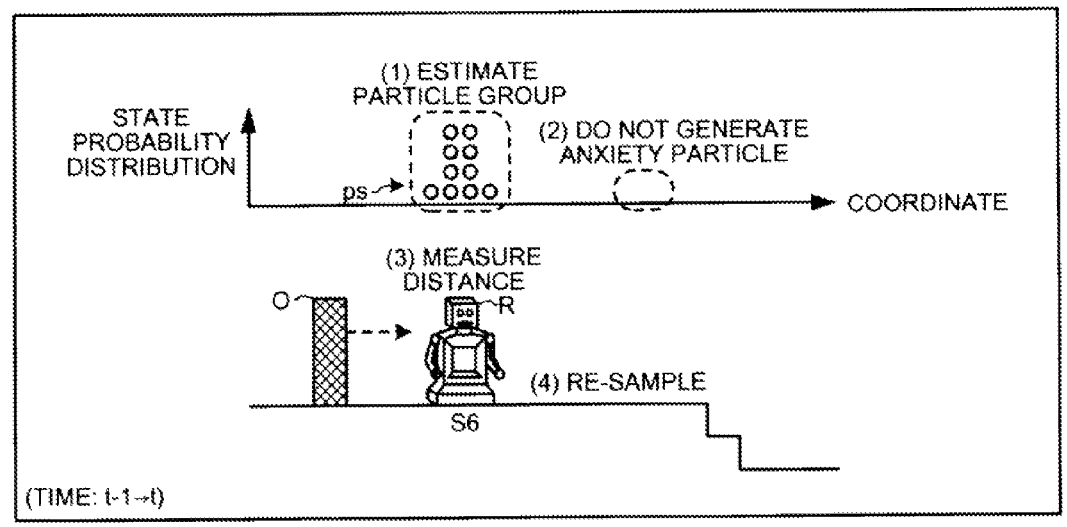
Figure 14C:
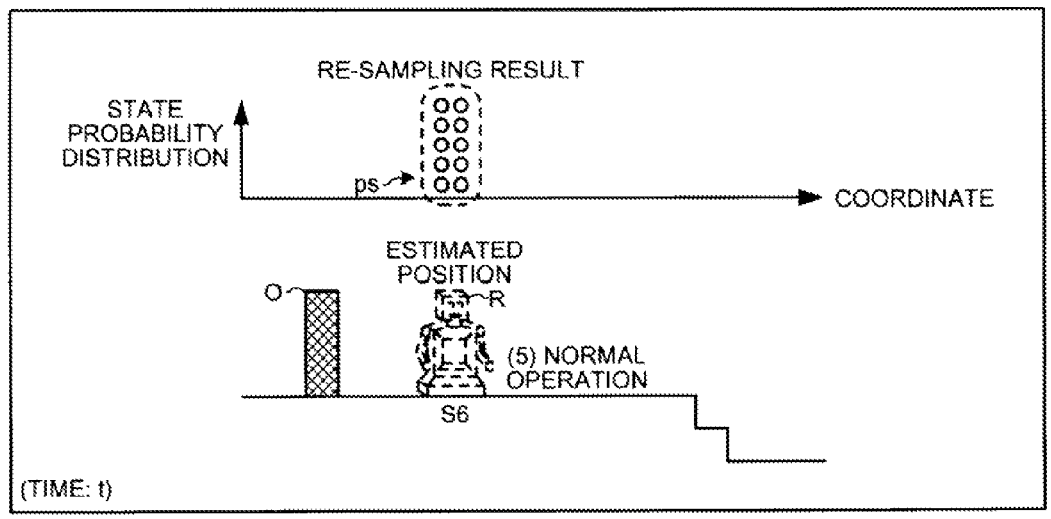

FIGS. 14A, 14B, 14C are explanatory diagrams of the second operation example of the estimating apparatus 200 according to the first embodiment. In the first operation example, the anxiety particles (a) are generated regardless of the accuracy of the position estimated by the robot R. In the second operation example, in contrast, the anxiety particles (a) are not generated when the accuracy of the position estimated by the robot R is high. In the second operation example, the anxiety particles (a) are generated when the accuracy of the position estimated by the robot R is low.

In this manner, when the accuracy of the present position is high, the robot R does not generate the anxiety particles (a), and thereby reduces the volume of processing. When the accuracy of the present position is low, the robot R generates the anxiety particles (a). Thus, when the position is in an area near the dangerous area D, the robot R can improve the accuracy of estimation of the position. As a result, when estimating the position to be in an area near the dangerous area D, the robot R moves away from the dangerous area D to avoid entering the dangerous area D.

As depicted in FIG. 14A, because the sum of the likelihood levels of the particle group (ps) estimated at the time "t−1" by the robot R is equal to or larger than the threshold, the position estimated by the robot R at the time "t−1" is considered to be highly accurate. In this case, the robot R is able to estimate the position at the next time "t" without generating anxiety particles (a) in an area near the dangerous area D.

As depicted in FIG. 14B, (1) at the next time "t", the robot R estimates a particle group (ps) indicating the position of the robot R at the time "t", from the particle group (ps) estimated at the time "t−1" indicated in FIG. 14A. (2) At this time, the robot R does not generate an anxiety particle group (as).

(3) The robot R measures the distance from the true position to the obstacle O using the sensor 204. (4) Based on the distance to the obstacle O, the robot R re-samples the particle group (ps).

As depicted in FIG. 14C, the particle group (ps) re-sampled in FIG. 14B indicates the position as a position S6. In this manner, the particle group (ps) indicating the estimated present position based on the particle group (ps) having a sum of likelihood levels equal to or larger than the threshold offers high accuracy in estimation. This allows the robot R to estimate the position of the robot R correctly. (5) Hence, by referring the dangerous area table 400, the robot R determines that the position S6 as the position is not in an area near the dangerous area D and carries out normal operation.

In this manner, when the accuracy of the estimated position is high, the robot R does not generate the anxiety particles (a), and thereby reduces the volume of processing. When the accuracy of the current position is low, the robot R generates the anxiety particles (a). When the position is in an area near the dangerous area D, therefore, the robot R improves the accuracy of estimation of the position. As a result, when estimating the position to be in an area near the dangerous area D, the robot R moves away from the dangerous area D to avoid entering the dangerous area D.

An anxiety particle generating process (step S1304) in the second operation example of the first embodiment will be described with reference to FIG. 15. The contents of the operation control process by the estimating apparatus 200 in the second operation example are the same as the contents of the operation control process by the estimating apparatus 200 in the first operation example depicted in FIG. 13 except for the anxiety particle generating process (step S1304), and is, therefore, omitted in further description.

Figure 15:
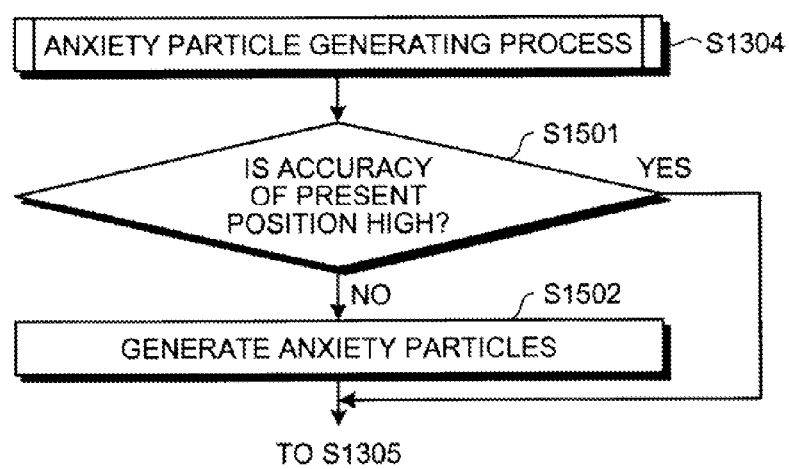
FIG. 15 is a flowchart of the contents of an anxiety particle generating process (step S1304) in the second operation example of the first embodiment.

FIG. 15 is a flowchart of the contents of the anxiety particle generating process (step S1304) in the second operation example of the first embodiment. In the anxiety particle generating process (step S1304), the estimating apparatus 200 determines whether the accuracy of the present position is high (step S1501). For example, when the sum of the likelihood levels of a particle group (ps) indicating the position at the time right before the current time is equal to or higher than the threshold, the estimating apparatus 200 determines the accuracy of the present position to be high. When the accuracy of the present position is high (step S1501: YES), the estimating apparatus 200 proceeds to step S1305 depicted in FIG. 13.

When the accuracy of the present position is low (step S1501: NO), the estimating apparatus 200 identifies an anxiety particle ID from the contents of the anxiety particle ID list field in a record of the dangerous area table 400, and generates anxiety particles (a) corresponding to the identified anxiety particle ID, based on the anxiety particle table 600 (step S1502), and transitions to step S1305 depicted in FIG. 13.

In this manner, when the accuracy of the current position is high, the estimating apparatus 200 does not generate the anxiety particles (a), and thereby reduces the volume of processing. When the accuracy of the current position is low, the estimating apparatus 200 generates the anxiety particles (a). Thus, when the position is in an area near the dangerous area D, the estimating apparatus 200 improves the accuracy of estimation of the position. As a result, when estimating the position to be in an area near the dangerous area D, the estimating apparatus 200 moves away from the dangerous area D to avoid entering the dangerous area D.

A third operation example of the estimating apparatus 200 according to the first embodiment will be described with reference to FIG. 16.

Figure 16:
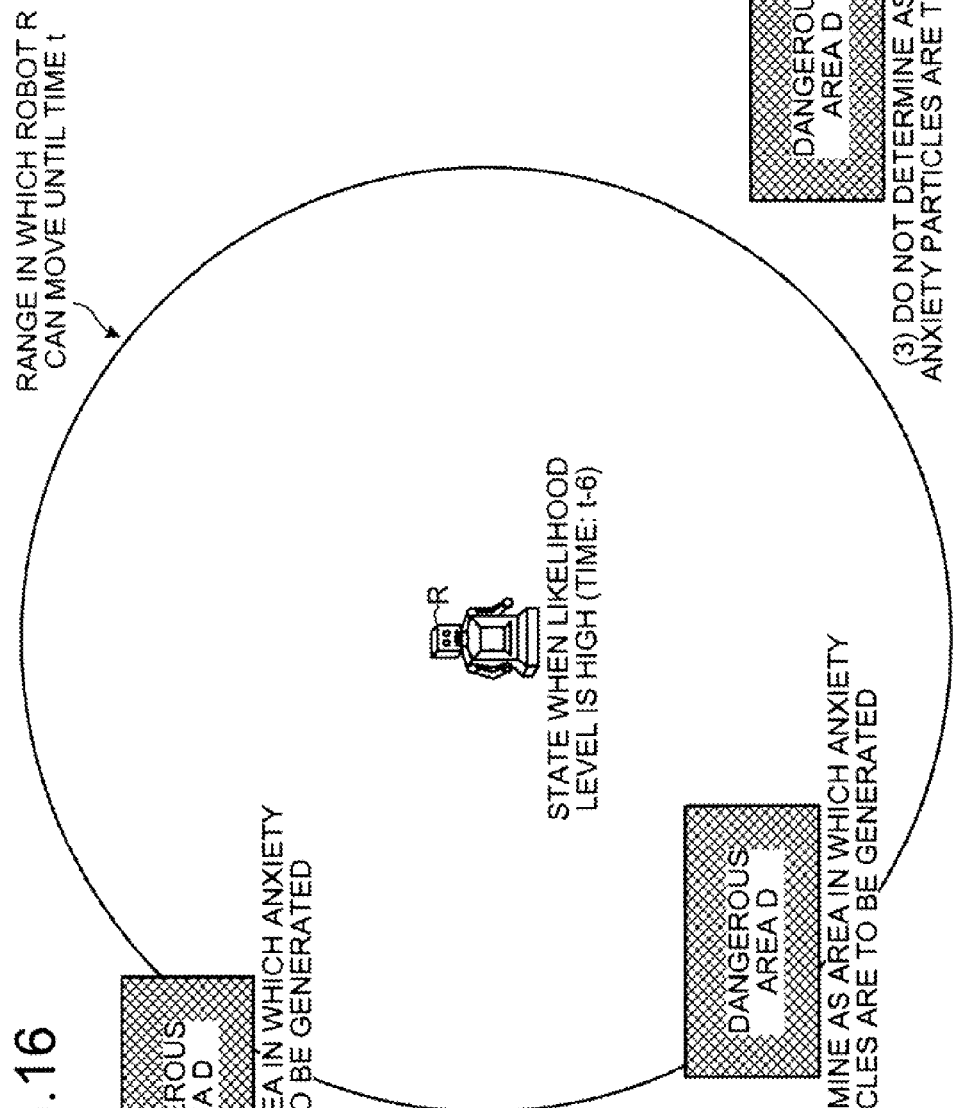
FIG. 16 is an explanatory diagram of a third operation example of the estimating apparatus 200 according to the first embodiment.

FIG. 16 is an explanatory diagram of the third operation example of the estimating apparatus 200 according to the first embodiment. In the first operation example, the anxiety particles (a) are generated regardless of whether the robot R may possibly enter the dangerous area D. In the third operation example, in contrast, the anxiety particles (a) are not generated in an area near the dangerous area D in which the robot R has no potential of entering.

In this manner, the robot R does not generate the anxiety particles (a) in an area near the dangerous area D in which the robot R has no potential of entering, and thereby reduces the volume of processing. The robot R generates the anxiety particles (a) in an area that is near the dangerous area D in which the robot R may possibly enter. Therefore, the robot R improves the accuracy of estimation of the position. As a result, when estimating the position to be in an area near the dangerous area D, the robot R moves away from the dangerous area D to avoid entering the dangerous area D.

As depicted in FIG. 16, in a case of the presence of a time "t−6" at which the sum of the likelihood levels of the estimated particle group (ps) is equal to or larger than the threshold and therefore the accuracy of the estimated position is high, the robot R calculates a range in which the robot R can move from the position estimated at the time "t−6" until the current time t" arrives.

For example, from the speed of the robot R at each of the times ranging from the time "t−6" to the current time "t", the robot R calculates the maximum travel distance that the robot R can travel from the time "t−6" to the current time "t". The robot R then calculates a circle with a radius defined as the maximum travel distance calculated based on the position estimated at the time "t−6", as the range in which the robot R can move.

In this case, the robot R may possibly enter a dangerous area D that overlaps the calculated range in which the robot R can move, but has no potential of entering a dangerous area D that does not overlap the calculated range in which the robot R can move. For this reason, the robot R generates the anxiety particles (a) in an area near the dangerous area D that overlaps the range in which the robot R can move, but does not generate the anxiety particles (a) in an area near the dangerous area D that does not overlap the range in which the robot R can move.

(1) For example, the robot R generates the anxiety particles (a) in an area near the dangerous area D that overlaps the range in which the robot R can move.

(2) The robot R generates the anxiety particles (a) in another area near the dangerous area D that overlaps the range in which the robot R can move.

The robot R, however, does not generates the anxiety particles (a) in an area near the dangerous area D that does not overlap the range in which the robot R can move.

In this manner, the robot R does not generate the anxiety particles (a) in an area near the dangerous area D in which the robot R has no potential of entering, and thereby reduces the volume of processing. The robot R generates the anxiety particles (a) in an area that is near the dangerous area D and in which the robot R may possibly enter. Therefore, the robot R improves the accuracy of estimation of the position. As a result, when estimating the position to be in an area near the dangerous area D, the robot R moves away from the dangerous area D to avoid entering the dangerous area D.

The contents of an operating control process by the estimating apparatus 200 in the third operating example of the first embodiment will be described.

The contents of the operation control process by the estimating apparatus 200 in the third operation example are the same as the contents of the operation control process by the estimating apparatus 200 in the first operation example depicted in FIG. 13 except for the anxiety particle generating process at step S1304, and is, therefore, omitted in further description.

The anxiety particle generating process (step S1304) in the third operating example of the first embodiment will be described with reference to FIG. 17.

FIG. 17 is a flowchart of the contents of the anxiety particle generating process (step S1304) in the third operating example of the first embodiment. In the anxiety particle generating process (step S1304), the estimating apparatus 200 determines whether particles (p) having a high level of likelihood exist within a given time period (step S1701).

When such particles (p) do not exist (step S1701: NO), the estimating apparatus 200 identifies an anxiety particle ID from the contents of the anxiety particle ID list field in a record of the dangerous area table 400, and generates anxiety particles (a) corresponding to the identified anxiety particle ID, based on the anxiety particle table 600 (step S1702). The estimating apparatus 200 then proceeds to step S1305 depicted in FIG. 13.

When such particles (p) exist (step S1701: YES), the estimating apparatus 200 identifies the time at which the particle (p) having the highest likelihood exists (step S1703). The estimating apparatus 200 then calculates the range in which the robot R can move at the current time, based on the state of the robot R from the identified time to the current time (step S1704).

From the contents of the anxiety particle ID list field in a record of the dangerous area table 400 indicating that the calculated range in which the robot R can move overlaps an area near the dangerous area D, the estimating apparatus 200 identifies an anxiety particle ID, based on the anxiety particle table 600 and generates anxiety particles (a) corresponding to the identified anxiety particle ID (step S1705). The estimating apparatus 200 then proceeds to step S1305 depicted in FIG. 13.

In this manner, the estimating apparatus 200 does not generate the anxiety particles (a) in an area near the dangerous area D in which the estimating apparatus 200 has no potential of entering, and thereby reduces the volume of processing. The estimating apparatus 200 generates the anxiety particles (a) in an area that is near the dangerous area D and in which the estimating apparatus 200 may possibly enter. Therefore, the estimating apparatus 200 improves the accuracy of estimation of the position. As a result, when estimating the position to be in an area near the dangerous area D, the estimating apparatus 200 moves away from the dangerous area D to avoid entering the dangerous area D.

A fourth operation example of the estimating apparatus 200 according to the first embodiment will be described. The fourth operation example is a combination of the second operating example and the third operating example. In the fourth operation example, no anxiety particle (a) is generated when the accuracy of the position estimated by the robot R is high, and no anxiety particle (a) is generated in an area that is near the dangerous area D in which the robot R has no potential of entering.

In this manner, when the accuracy of the estimated position is high, the estimating apparatus 200 does not generate the anxiety particles (a), and thereby reduces the volume of processing. When the accuracy of the current position is low, the estimating apparatus 200 generates the anxiety particles (a). Thus, when the position is in an area near the dangerous area D, the estimating apparatus 200 improves the accuracy of estimation of the position.

In this manner, the estimating apparatus 200 does not generate the anxiety particles (a) in an area near the dangerous area D in which the estimating apparatus 200 has no potential of entering, and thereby reduces the volume of processing. The estimating apparatus 200 generates the anxiety particles (a) in an area that is near the dangerous area D in which the estimating apparatus 200 may possibly enter. Therefore, the estimating apparatus 200 improves the accuracy of estimation of the position. As a result, when estimating the position to be in an area near the dangerous area D, the estimating apparatus 200 moves away from the dangerous area D to avoid entering the dangerous area D.

The contents of an operation control process by the estimating apparatus 200 in the fourth operation example are the same as the contents of the operation control process by the estimating apparatus 200 in the first operation example depicted in FIG. 13 except for the anxiety particle generating process at step S1304, and is, therefore, omitted in further description. The anxiety particle generating process (step S1304) in the fourth operating example of the first embodiment will be described, with reference to FIG. 18.

FIG. 18 is a flowchart of the contents of the anxiety particle generating process (step S1304) in the fourth operation example of the first embodiment. In the anxiety particle generating process (step S1304), the estimating apparatus 200 determines whether the accuracy of the current position is high (step S1801). For example, when the sum of the likelihood levels of a particle group (ps) indicating the position at the time right before the current time is equal to or higher than the threshold, the estimating apparatus 200 determines the accuracy of the current position to be high. When the accuracy of the current position is high (step S1801: YES), the estimating apparatus 200 proceeds to step S1305 depicted in FIG. 13.

When the accuracy of the position is low (step S1801: NO), the estimating apparatus 200 determines whether particles (p) having a high level of likelihood exist within a given time period (step S1802). When such particles (p) do not exist (step S1802: NO), the estimating apparatus 200 identifies an anxiety particle ID from the contents of the anxiety particle ID list field in a record of the dangerous area table 400, and generates anxiety particles (a) corresponding to the identified anxiety particle ID, based on the anxiety particle table 600 (step S1803). The estimating apparatus 200 then proceeds to step S1305 depicted in FIG. 13.

When such particles (p) exist (step S1802: YES), the estimating apparatus 200 identifies the time at which the particle (p) having the highest likelihood exists (step S1804). The estimating apparatus 200 then calculates the range in which the robot R can move at the current time, from the state of the robot R from the identified time to the current time (step S1805).

From the contents of the anxiety particle ID list field in a record of the dangerous area table 400 indicating that the calculated range in which the robot R can move overlaps an area near the dangerous area D, the estimating apparatus 200 identifies an anxiety particle ID, and generates anxiety particles (a) corresponding to the identified anxiety particle ID, based on the anxiety particle table 600 (step S1806). The estimating apparatus 200 then proceeds to step S1305 depicted in FIG. 13.

In this manner, when the accuracy of the estimated position is high, the estimating apparatus 200 does not generate the anxiety particles (a), and thereby reduces the volume of processing. When the accuracy of the current position is low, the estimating apparatus 200 generates the anxiety particles (a). Thus, when the position is in an area near the dangerous area D, the estimating apparatus 200 improves the accuracy of estimation of the position.

In this manner, the estimating apparatus 200 does not generate the anxiety particles (a) in an area near the dangerous area D in which the estimating apparatus 200 has no potential of entering, and thereby reduces the volume of processing. The estimating apparatus 200 generates the anxiety particles (a) in an area that is near the dangerous area D in which the estimating apparatus 200 may possibly enter. Therefore, the estimating apparatus 200 improves the accuracy of estimation of the position. As a result, when estimating the position to be in an area near the dangerous area D, the estimating apparatus 200 moves away from the dangerous area D to avoid entering the dangerous area D.

As described above, the estimating apparatus 200 of the first embodiment generates not only the particle group (ps) indicating the estimated state of the mobile body (estimating apparatus 200 itself) but also the anxiety particle group (as) indicating the state of the mobile body in an area near the dangerous area D. The estimating apparatus 200 carries out re-sampling based on the level of likelihood of each particle of the particle group (ps) and the level of likelihood of the anxiety particle group (as). The estimating apparatus 200 then re-estimates the state of the mobile body based on the particle group (ps) re-selected as a result of the re-sampling.

In this process, if the true position of the estimating apparatus 200 is in an area near the dangerous area D, the level of likelihood of the anxiety particle (a) is high. As a result, through re-sampling, the anxiety particle (a) indicating the state of the mobile body in an area near the dangerous area D is preferentially selected as a particle (p) of the particle group (ps). Thus, when the true position is in an area near the dangerous area D, the estimating apparatus 200 can improve the accuracy of estimation of the position by using the particle group (ps) re-selected as a result of the re-sampling.

The estimating apparatus 200 does not generate the anxiety particles (a) when the accuracy of the estimated state of the mobile body is high, and thereby reduces the volume of processing. The estimating apparatus 200 generates the anxiety particles (a) when the accuracy of the present position is low. At this time, if the true position of the estimating apparatus 200 is in an area near the dangerous area D, the level of likelihood of the anxiety particle (a) is high. As a result, through re-sampling, the anxiety particle (a) indicating the state of the mobile body to be in an area near the dangerous area D is preferentially selected as a particle (p) of the particle group (ps). Thus, when the true position is in an area near the dangerous area D, the estimating apparatus 200 can improve the accuracy of estimation of the position by using the particle group (ps) re-selected as a result of the re-sampling.

An area near a dangerous area D that does not overlap a range in which the mobile body can move is an area that is near a dangerous area D in which the mobile body has no potential of entering. For such a case, the estimating apparatus 200 does not generate the anxiety particles (a), and thereby reduces the volume of processing. An area near a dangerous area D that overlaps the range in which the mobile body can move is an area near a dangerous area D in which the mobile body may possibly enter. For such a case, the estimating apparatus 200 generates the anxiety particles (a). At this time, if the true position of the estimating apparatus 200 is in an area near the dangerous area D, the level of likelihood of the anxiety particle (a) is high. As a result, through re-sampling, the anxiety particle (a) indicating the state of the mobile body to be in an area near the dangerous area D is preferentially selected as a particle (p) of the particle group (ps). Thus, when the true position is in an area near the dangerous area D in which the mobile body may possibly enter, the estimating apparatus 200 can improve the accuracy of estimation of the position by using the particle group (ps) re-selected as a result of the re-sampling.

When the estimated position of the mobile body is in an area near the dangerous area D, the estimating apparatus 200 moves the mobile body away from the dangerous area D. The estimating apparatus 200, therefore, can prevent the mobile body from entering the dangerous area D.

A second embodiment will be described. The first embodiment is the example of estimation of the position of the mobile body that is the estimating apparatus 200 itself. The second embodiment is the example of estimation of the position of the mobile body that is an apparatus different from the estimating apparatus 200. For example, the second embodiment is explained as a case where a vehicle is adopted as the estimating apparatus 200 and another vehicle traveling ahead of the estimating apparatus 200 is adopted as the mobile body. In this case, the vehicle (estimating apparatus 200) estimates the position of the vehicle ahead (mobile body) and avoids a situation where the vehicle ahead approaches a vicinity (dangerous area D) of the vehicle.

The contents of estimation by the estimating apparatus 200 of the position of the vehicle ahead according to the second embodiment will be described, with reference to FIGS. 19A, 19B, 19C.

Figure 19A:
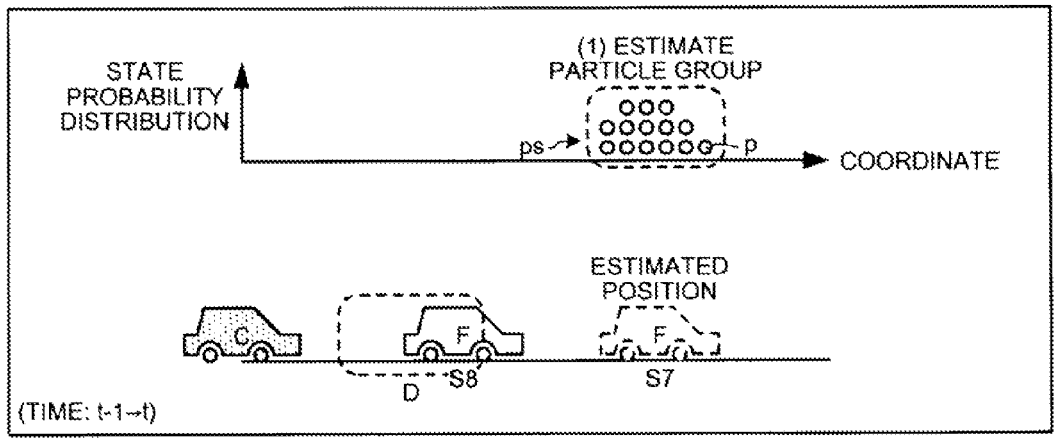
FIGS. 19A, 19B, 19C are explanatory diagrams of the contents of estimation, by the estimating apparatus 200, of the position of a vehicle ahead according to a second embodiment.
Figure 19B:
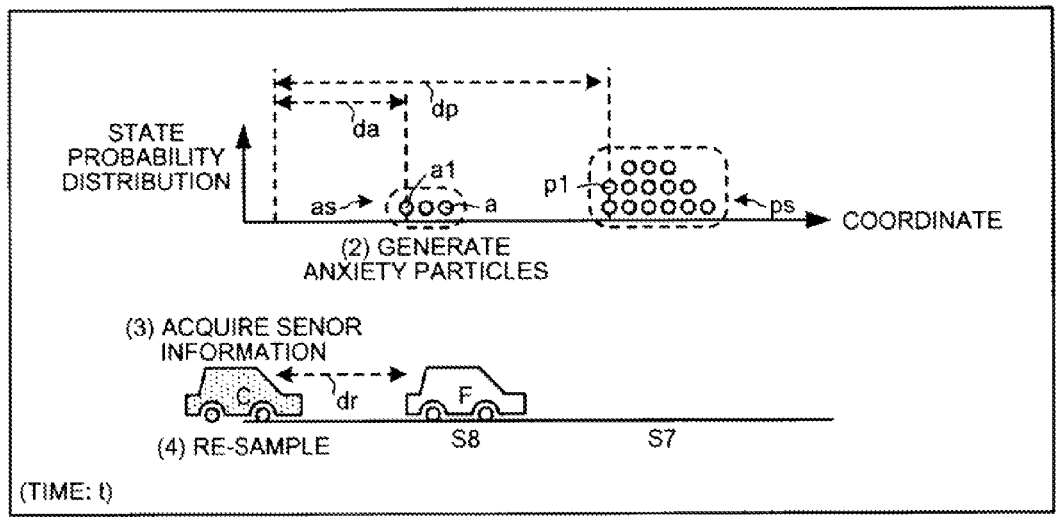
Figure 19C:
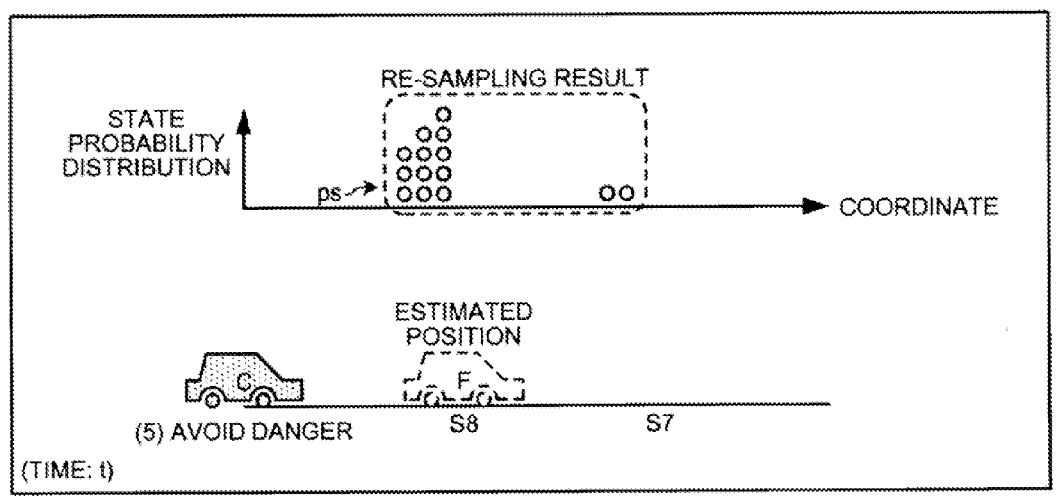

FIGS. 19A, 19B, 19C are explanatory diagrams of the contents of estimation, by the estimating apparatus 200, of the position of the vehicle ahead according to the second embodiment. In an example depicted in FIGS. 19A, 19B, 19C, a vehicle C has position information concerning the dangerous area D, estimates the position of a vehicle F traveling ahead of the vehicle C, and moves so that the vehicle ahead F does not enter an area near the dangerous area D.

In FIG. 19A, (1) the vehicle C estimates a particle group (ps) indicating the state of the vehicle ahead F at the current time "t" from a particle group (ps) indicating the state of the vehicle ahead F at a time "t−1" in the past through a simulation using a particle filter. A state $A_t$ of the vehicle ahead F is represented by equation (4).

In the equation (4), $W_t$ denotes the width of the vehicle ahead F, $X_t$ denotes the (longitudinal) distance from the vehicle C to the vehicle ahead F, $VX_t$ denotes the relative speed of the vehicle ahead F to the speed of the vehicle C in the lateral direction, and $VZ_t$ denotes the relative speed of the vehicle ahead F to the speed of the vehicle C in the longitudinal direction.

$$A_t = [W_t, X_t, Z_t, vx_t, vz_t] \quad (4)$$

For example, the vehicle C substitutes a state $A_{t-1}$ of the vehicle ahead F indicated by each particle of the particle group (ps) into state equations (5) and (6) to calculate the current state $A_t$ of each particle (p). In the state equations (5) and (6), $\Delta t$ denotes a time step representing an interval at which estimation of the state of the vehicle ahead F is carried out, and is equivalent to "(t)−(t−1)".

$$A_t = FA_{t-1} + \eta_t \quad (5)$$

$$F = \begin{pmatrix} 1 & 0 & 0 & 0 & 0 \\ 0 & 1 & 0 & \Delta T & 0 \\ 0 & 0 & 1 & 0 & \Delta T \\ 0 & 0 & 0 & 1 & 0 \\ 0 & 0 & 0 & 0 & 1 \end{pmatrix} \quad (6)$$

In this manner, the vehicle C is able to estimate the particle group (ps) indicating the state of the vehicle ahead F at the time "t". In this example, the vehicle C estimates the position of the vehicle ahead F at the time "t" to be a position S7 based on the particle group (ps) indicating the state of the vehicle ahead F at the time "t".

However, the true position of the vehicle ahead F is a position S8 near the dangerous area D, which means that the vehicle C erroneously estimates the position of the vehicle ahead F.

In FIG. 19B, (2) the vehicle C generates an anxiety particle group (as) indicating the state of the vehicle ahead F to be in an area near the dangerous area D based on position information concerning the dangerous area D, in addition to the particle group (ps) indicating the estimated state of the vehicle ahead F at the time "t".

(3) The vehicle C then measures the distance dr to the position of the vehicle ahead F, using the sensor 204. The vehicle C also measures coordinate values for the left and right ends of the vehicle ahead F, using the sensor 204.

(4) The vehicle C calculates the distance to the position of the vehicle ahead F and the coordinate values for the left and right ends of the vehicle ahead F, the distance and coordinate values being indicated by each particle of the particle group (ps) and each particle of the anxiety particle group (as), using equations (7) and (8). The distance to the vehicle ahead F means, for example, the distance dp to the position of the vehicle ahead F indicated by a particle p1 and the distance da to the position of the vehicle ahead F indicated by a particle pa.

$$y_t = HA_t + \varepsilon_t \quad (7)$$

$$H = \begin{pmatrix} -0.5 & 1 & 0 & 0 & 0 \\ 0.5 & 1 & 0 & 0 & 0 \\ 0 & 0 & 1 & 0 & 0 \end{pmatrix} \quad (8)$$

The vehicle C calculates a level of likelihood through comparison of the calculated distance to the position of the vehicle ahead F and the calculated coordinate values for the left and right ends of the vehicle ahead F, the calculated distance and coordinate values being indicated by each particle, with the measured distance to the position of the vehicle ahead F and the measured coordinate values for the left and right ends of the vehicle ahead F. Based on the calculated level of likelihood, the vehicle C re-samples the particle group (ps) indicating the position of the vehicle ahead F at the current time "t".

For example, in a multivariate normal distribution with an expected value being a value indicating the measured state of the vehicle ahead F, the vehicle C calculates a probability p that the expected value becomes equal to a value indicative of the state of the vehicle ahead F indicated by the particle (p) $(Y_t | A_{t/t-1}^{(i)})$, using equation (9), where $Y_t$ denotes a value indicative of the state of the vehicle ahead F measured by the sensor 204 (e.g., the distance to the position of the vehicle ahead F and the coordinate values for the left and right ends of the vehicle ahead F), $Y_t^{(i)}$ denotes a value indicative of the calculated state of the vehicle ahead F (e.g., the distance to the position of the vehicle ahead F and the coordinate values for the left and right ends of the vehicle ahead F), $\rho$ denotes the number of dimensions (e.g., three in this example), i denotes a number for a particle, and $\Sigma$ denotes a variance-covariance matrix.

$$p(y_t | A_{t|t-1}^{(i)}) = p(y_t | y_t^{(i)}) = \frac{1}{(2\pi)^{\frac{\rho}{2}} |\Sigma|^{\frac{1}{2}}} \exp\left(-\frac{1}{2}(y_t - y_t^{(i)})^T \Sigma^{-1}(y_t - y_t^{(i)})\right) \quad (9)$$

The estimating apparatus 200 determines the calculated probability to be a level of likelihood of the particle (p). In FIGS. 19A, 19B, 19C, the distance to the position indicated by the particle (p) and the coordinate values for the left and right ends of the vehicle ahead F indicated by the particle (p) are widely different from the distance to the true position of the vehicle ahead F and the true coordinate values for the left and right ends of the vehicle ahead F. As a result, the level of likelihood of the particle p is low.

In the same manner as described above, the vehicle C calculates a level of likelihood through comparison of the distance to the position of the vehicle ahead F and the coordinate values for the left and right ends of the vehicle ahead F, the distance and coordinate values being indicated by the anxiety particle (a), with the measured distance to the position of the vehicle ahead F and the measured coordinate values for the left and right ends of the vehicle ahead F.

For example, in a multivariate normal distribution with an expected value being the measured distance to the position of the vehicle ahead F and the measured coordinate values for the left and right ends of the vehicle ahead F, the vehicle C calculates a probability that the expected value becomes equal to the distance to the position and the coordinate values for the left and right ends of the vehicle ahead F, the distance and coordinate values being indicated by the anxiety particle (a), using equation (9).

The estimating apparatus 200 determines the calculated probability to be a level of likelihood of the anxiety particle (a). In FIGS. 19A, 19B, 19C, the distance to the position indicated by the anxiety particle (a) and the coordinate values for the left and right ends of the vehicle ahead F indicated by the anxiety particle (a) are slightly different from the measured distance to the position of the vehicle ahead F and the measured coordinate values for the left and right ends of the vehicle ahead F. As a result, the level of likelihood of the particle p is high.

In FIG. 19C, in re-sampling of the particle group (ps), the vehicle C preferentially re-selects each particle (a) of the anxiety particle group (as) higher in level of likelihood than each particle (p) of the particle group (ps), as a particle (p) of the particle group (ps).

(5) Based on the result of the re-sampling, the vehicle C estimates the position of the vehicle ahead F at the time "t" to be the position S8. The vehicle C then determines that the position S8 of the vehicle ahead F is included in a range of an area near the dangerous area D identified from the contents of the neighboring area field in the dangerous area table 400 and thus, reduces the speed of the vehicle C to prevent the vehicle ahead F from entering the dangerous area D.

In this manner, even when the particle group (ps) indicating the position of the vehicle ahead F at the current time "t" estimated by the simulation using the particle filter is not present in an area near the dangerous area D, the vehicle C is able to estimate the position of the vehicle ahead F to be in an area near the dangerous area D. As a result, when the position of the vehicle ahead F is in an area near the dangerous area D (vicinity of the vehicle C), the vehicle C moves so that the vehicle F becomes distant from the dangerous area D, thereby prevents the vehicle ahead F from entering the dangerous area D.

In FIGS. 19A, 19B, 19C, the vehicle C reduces the speed of the vehicle C when the vehicle ahead F is in an area near the dangerous area D. This is, however, not the only case. For example, when the position of the vehicle ahead F is in an area near the dangerous area D, the vehicle C may cause the output device 205 to issue a warning to the driver of the vehicle C.

In FIGS. 19A, 19B, 19C, the vehicle C estimates the position of the vehicle ahead F. This is, however, not the only case. For example, the vehicle C may estimate the position of a vehicle traveling behind the vehicle C. In FIGS. 19A, 19B, 19C, the vehicle C estimates the position of one vehicle ahead F. This is, however, not the only case. For example, when multiple lanes are present, the vehicle C may estimate the position of each vehicle ahead F traveling in each lane.

In FIGS. 19A, 19B, 19C, the dangerous area D is a fixed area. This is, however, not the only case. For example, the dangerous area D may be a variable area that varies depending on the relative speed of the vehicle ahead F to the vehicle C.

Figure 20:
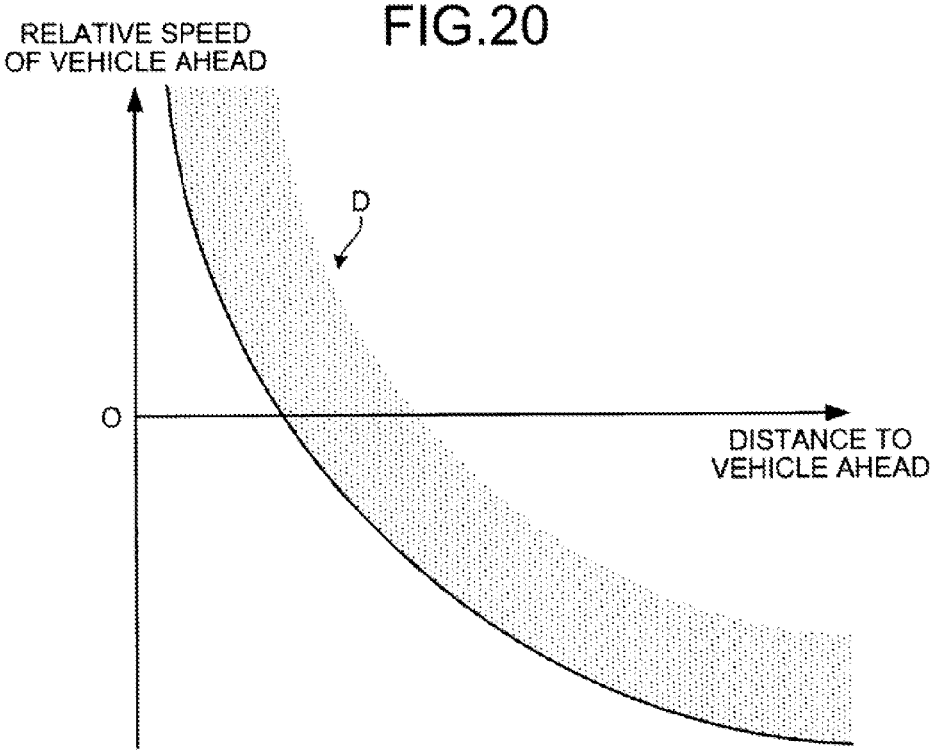
FIG. 20 is an explanatory diagram of an example of a variable dangerous area D.

FIG. 20 is an explanatory diagram of an example of a variable dangerous area D. For example, when the relative speed of the vehicle ahead F to the vehicle C is positive, the vehicle-to-vehicle distance between the vehicle C and the vehicle ahead F grows larger as time elapses. The possibility of a collision, therefore, is low even if the present vehicle-to-vehicle distance is relatively small. In contrast, when the relative speed of the vehicle ahead F to the vehicle C is negative and the absolute value of the relative speed is large, the vehicle-to-vehicle distance becomes shorter as time elapses, in which case a larger vehicle-to-vehicle distance is needed to avoid a collision. For this reason, as depicted in FIG. 20, an area a further distance from the vehicle C may be determined to be the dangerous area D as the absolute value of the negative relative speed of the vehicle ahead F to the vehicle C grows larger.

The contents of an operating control process by the estimating apparatus 200 in a first operating example of the second embodiment will be described with reference to FIG. 21.

FIG. 21 is a flowchart of the contents of the operating control process by the estimating apparatus 200 in the first operating example of the second embodiment. The estimating apparatus 200 first carries out an initializing process (step S2101). In the initializing process, the estimating apparatus 200 reads information concerning an object in a space from the object table 300 and information concerning the dangerous area D in the space from the dangerous area table D, and generates particles (p) uniformly in the space.

The estimating apparatus 200 then carries out simulation using the particle filter to estimate a particle group (ps) indicating the state of the vehicle ahead F at the current time from a particle group (ps) indicating the state of the vehicle ahead F right before the current time (step S2102). The process at step S2102 corresponds to the process by the estimating apparatus 200 depicted in FIG. 19A.

The estimating apparatus 200 measures the distance from the estimating apparatus 200 to the vehicle ahead F using the sensor 204 (step S2103). Subsequently, the estimating apparatus 200 executes an anxiety particle generating process (step S2104).

In the anxiety particle generating process, the estimating apparatus 200 identifies an anxiety particle ID from the contents of the anxiety particle ID field in a record of the dangerous area table 400, and generates anxiety particles (a) corresponding to the identified anxiety particle ID, based on the anxiety particle table 600.

The estimating apparatus 200 then calculates a level of likelihood for each particle of the particle group (ps) estimated at step S2102 and for each particle of the anxiety particle group (as) estimated at step S2104 (step S2105). The processes at steps S2103 to S2105 correspond to the process by the estimating apparatus 200 depicted in FIG. 19B).

The estimating apparatus 200 carries out re-sampling of the particle group (ps) generated at step S2102, based on the level of likelihood of each particle calculated at step S2105, and identifies the current state of the vehicle ahead F (step S2106). The estimating apparatus 200 then determines operation according to the identified current state of the vehicle ahead F (step S2107). The processes at steps S2106 and S2107 correspond to the process by the estimating apparatus 200 depicted in FIG. 19C.

Subsequently, the estimating apparatus 200 determines whether the operation has come to an end (step S2108). If the operation has not come to an end (step S2108: NO), the estimating apparatus 200 returns to step S1302.

If the operation has come to an end (step S2108: YES), the estimating apparatus 200 ends the operation control process. In this manner, the estimating apparatus 200 estimates the state of the vehicle ahead F and moves while preventing the vehicle ahead F from entering the dangerous area D.

A second operation example of the estimating apparatus 200 according to the second embodiment will be described with reference to FIGS. 22A, 22B, 22C.

Figure 22A:
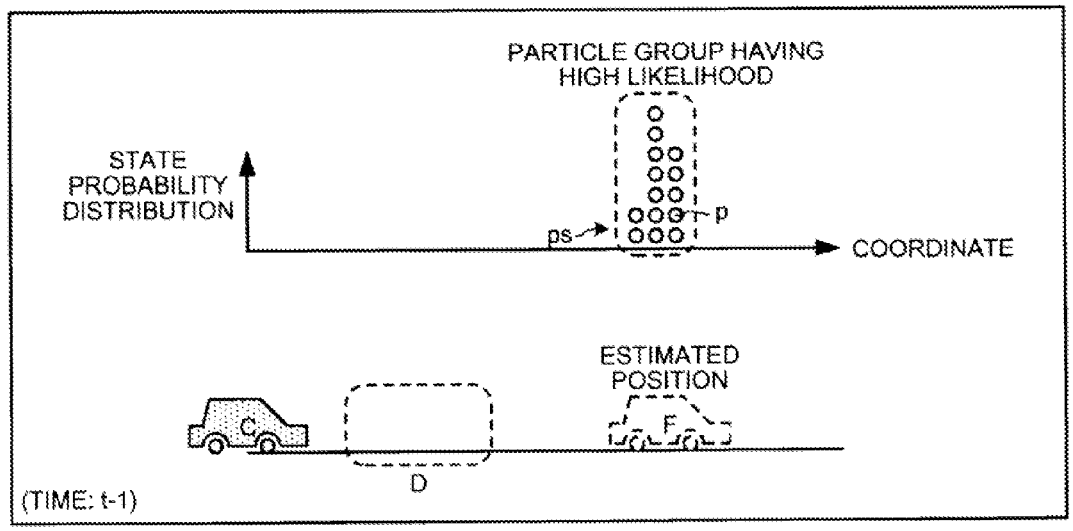
FIGS. 22A, 22B, 22C are explanatory diagrams of a second operation example of the estimating apparatus 200 according to the second embodiment.
Figure 22B:
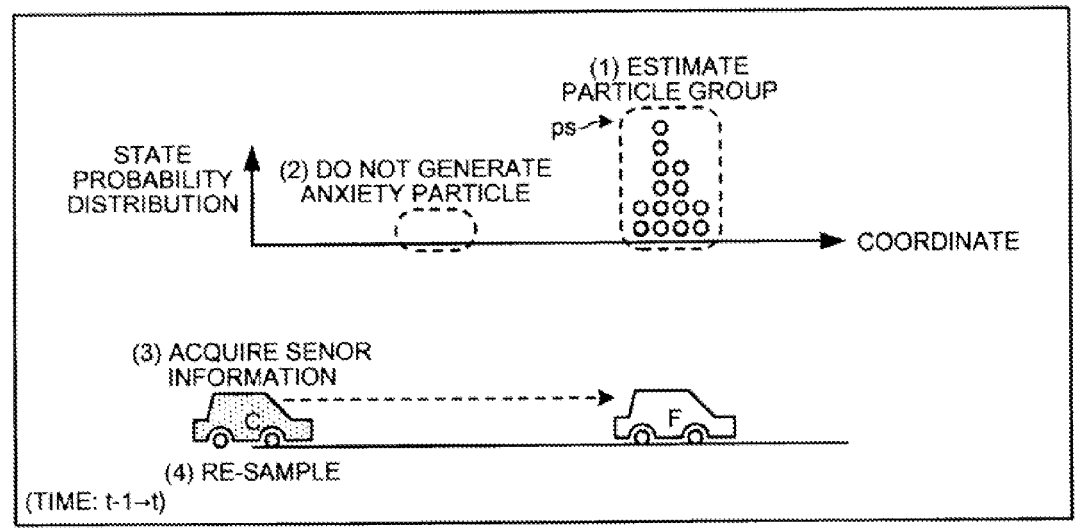
Figure 22C:
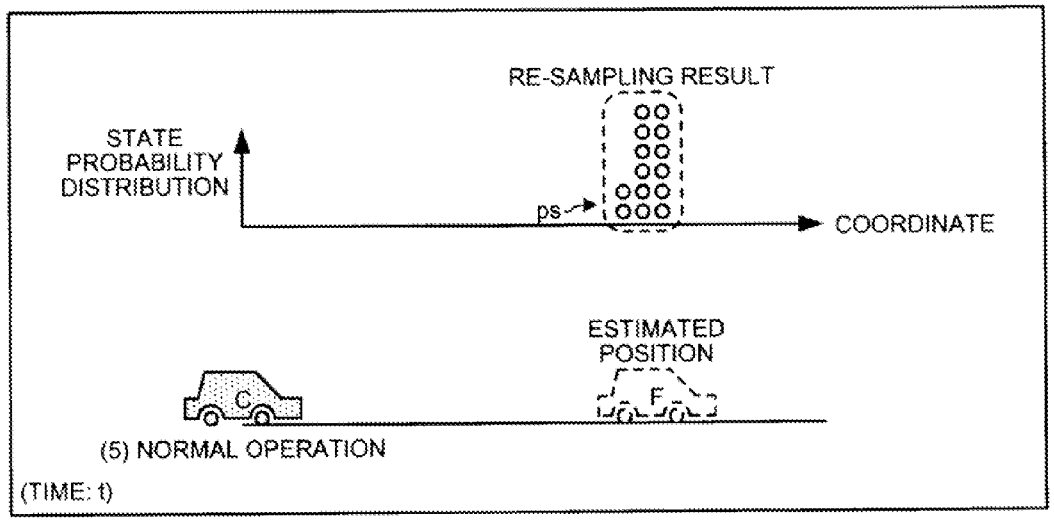

FIGS. 22A, 22B, 22C are explanatory diagrams of the second operation example of the estimating apparatus 200 according to the second embodiment. In the first operation example, the anxiety particles (a) are generated regardless of the accuracy of the position of the vehicle ahead F estimated by the vehicle C. In the second operation example, in contrast, the anxiety particles (a) are not generated when the accuracy of the position of the vehicle ahead F estimated by the vehicle C is high. In the second operation example, the anxiety particles (a) are generated when the accuracy of the position of the vehicle ahead F estimated by the vehicle C is low.

In this manner, when the accuracy of the current position of the vehicle ahead F is high, the vehicle C does not generate the anxiety particles (a), and thereby reduces the volume of processing. When the accuracy of the current position of the vehicle ahead F is low, the vehicle C generates the anxiety particles (a). Thus, when the position of the vehicle ahead F is in an area near the dangerous area D, the vehicle C can improve the accuracy of estimation of the position of the vehicle ahead F. As a result, when estimating the position of the vehicle ahead F to be in an area near the dangerous area D (a vicinity of vehicle C), the vehicle C moves such that the vehicle ahead F can be prevented from entering the dangerous area D.

As depicted in FIG. 22A, because the sum of the likelihood levels of the particle group (ps) estimated at the time "t−1" by the vehicle C is equal to or larger than the threshold, the position of the vehicle ahead F estimated by the vehicle C at the time "t−1" is considered to be highly accurate. In this case, the vehicle C is able to estimate the position of the vehicle ahead F at the next time "t" without generating anxiety particles (a) in an area near the dangerous area D.

As depicted in FIG. 22B, (1) at the next time "t", the vehicle C estimates a particle group (ps) indicating the position of the vehicle ahead F of the vehicle C at the time "t", from the particle group (ps) estimated at the time "t−1" indicated in FIG. 22A. (2) At this time, the vehicle C does not generate an anxiety particle group (as).

(3) The vehicle C then measures the distance to the true position of the vehicle ahead F and coordinate values for the left end and the right end of the vehicle ahead F, using the sensor 204. (4) The vehicle C then re-samples the particle group (ps) based on the measured distance to the position of the vehicle ahead F and the measured coordinate values for the left end and right ends of the vehicle ahead F.

As depicted in FIG. 22C, the position of the vehicle ahead F indicated by the particle group (ps) re-sampled in FIG. 22B is the same as the true position of the vehicle ahead F. In this manner, the particle group (ps) indicating the current position of the vehicle ahead F estimated based on the particle group (ps) having a sum of likelihood levels equal to or larger than the threshold is highly accurate. As a result, the vehicle C is able to correctly estimate the position of the vehicle ahead F. (5) Referring to the dangerous area table 400, the vehicle C then determines that the position of the vehicle ahead F is not in an area near the dangerous area D, and carries out a normal operation.

In this manner, when the accuracy of the current position of the vehicle ahead F estimated by the vehicle C is high, the vehicle C does not generate the anxiety particles (a), and thereby reduces the volume of processing. When the accuracy of the current position of the vehicle ahead F is low, the vehicle C generates the anxiety particles (a). Thus, when the position of the vehicle ahead F is in an area near the dangerous area D, the vehicle C can improve the accuracy of estimation of the position of the vehicle ahead F. As a result, when estimating the position of the vehicle ahead F to be in an area near the dangerous area D (a vicinity of vehicle C), the vehicle C moves such that the vehicle ahead F can be prevented from entering the dangerous area D.

The contents of an operating control process by the estimating apparatus 200 in a second operating example of the second embodiment will be described.

The contents of the operation control process by the estimating apparatus 200 in the second operation example are the same as the contents of the operation control process by the estimating apparatus 200 in the first operation example depicted in FIG. 21 except for the anxiety particle generating process at step S2104, and is, therefore, omitted in further description.

The anxiety particle generating process (step S2104) in the operation example 2 of the second embodiment will be described with reference to FIG. 23.

Figure 23:
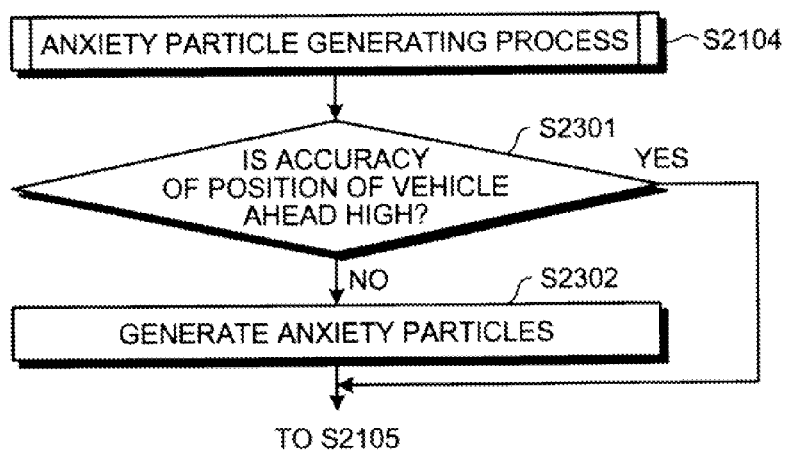
FIG. 23 is a flowchart of the contents of the anxiety particle generating process (step S2104) in the second operation example of the second embodiment.

FIG. 23 is a flowchart of the contents of the anxiety particle generating process (step S2104) in the second operation example of the second embodiment. In the anxiety particle generating process (step S2104), the estimating apparatus 200 determines whether the accuracy of current position of the vehicle ahead F is high (step S2301). For example, when the sum of the likelihood levels of a particle group (ps) indicating the position of the vehicle ahead F at the time right before the current time is equal to or higher than the threshold, the estimating apparatus 200 determines the accuracy of current position of the vehicle ahead F to be high. When the accuracy of current position of the vehicle ahead F is high (step S2301: YES), the estimating apparatus 200 proceeds to step S2105 depicted in FIG. 21.

When the accuracy of the current position is low (step S2301: NO), the estimating apparatus 200 identifies an anxiety particle ID from the contents of the anxiety particle ID list field in a record of the dangerous area table 400, and generates anxiety particles (a) corresponding to the identified anxiety particle ID, based on the anxiety particle table 600 (step S2302), and transitions to step S2105 depicted in FIG. 21.

In this manner, when the accuracy of the current position of the vehicle ahead F is high, the estimating apparatus 200 does not generate the anxiety particles (a), and thereby reduces the volume of processing. When the accuracy of the current position of the vehicle ahead F is low, the estimating apparatus 200 generates the anxiety particles (a). Thus, when the position of the vehicle ahead F of the vehicle ahead F is in an area near the dangerous area D, the estimating apparatus 200 can improve the accuracy of estimation of the position of the vehicle ahead F of the vehicle ahead F. As a result, when estimating the position of the vehicle ahead F of the vehicle ahead F to be in an area near the dangerous area D, the estimating apparatus 200 moves such that the vehicle ahead F can be prevented from entering the dangerous area D.

A third operation example of the estimating apparatus 200 according to the second embodiment will be described with reference to FIG. 24.

FIG. 24 is an explanatory diagram of the third operation example of the estimating apparatus 200 according to the second embodiment. In the first operation example, the anxiety particles (a) are generated regardless of whether the vehicle ahead F may possibly enter the dangerous area D. In the third operation example, in contrast, the anxiety particles (a) are not generated in an area near the dangerous area D in which the vehicle ahead F has no potential of entering.

In this manner, the vehicle C does not generate the anxiety particles (a) in an area near the dangerous area D in which the vehicle ahead F has no potential of entering, and thereby reduces the volume of processing. The vehicle C generates the anxiety particles (a) in an area that is near the dangerous area D in which the vehicle ahead F may possibly enter. Therefore, the vehicle C improves the accuracy of estimation of the position of the vehicle ahead F. As a result, when estimating the position of the vehicle ahead F to be in an area near the dangerous area D (a vicinity of vehicle C), the vehicle C moves such that the vehicle ahead F can be prevented from entering the dangerous area D.

As depicted in FIG. 24, in a case of the presence of a time "t−6" at which the sum of the likelihood levels of the estimated particle group (ps) is equal to or larger than the threshold and therefore the accuracy of the estimated position is high, the vehicle C calculates a range in which the vehicle ahead F can move from the position of the vehicle ahead F estimated at the time "t−6" until the current time t" arrives.

For example, from the speed of the vehicle ahead F at each of the times ranging from the time "t−6" to the current time "t", the vehicle C calculates the maximum travel distance that the vehicle ahead F can travel from the time "t−6" to the current time "t". The vehicle C then calculates a circle with a radius defined as the maximum travel distance calculated based on the position of the vehicle ahead F estimated at the time "t−6", as the range in which the vehicle ahead F can move.

In this case, the vehicle ahead F may possibly enter a dangerous area D that overlaps the calculated range in which the vehicle ahead F can move, but has no potential of entering a dangerous area D that does not overlap the calculated range in which the vehicle ahead F can move.

(1) The vehicle C generates the anxiety particles (a) in an area near the dangerous area D that overlaps the range in which the vehicle ahead F can move.

(2) The vehicle C generates the anxiety particles (a) in another area near the dangerous area D that overlaps the range in which the vehicle ahead F can move.

The vehicle C, however, does not generate the anxiety particles (a) in an area near the dangerous area D that does not overlap the range in which the vehicle ahead F can move.

In this manner, the vehicle C does not generate the anxiety particles (a) in an area near the dangerous area D in which the vehicle ahead F has no potential of entering, and thereby reduces the volume of processing. The vehicle C generates the anxiety particles (a) in an area that is near the dangerous area D in which the vehicle ahead F may possibly enter. Therefore, the vehicle C improves the accuracy of estimation of the position of the vehicle ahead F. As a result, when estimating the position of the vehicle ahead F to be in an area near the dangerous area D (a vicinity of vehicle C), the vehicle C moves such that the vehicle ahead F can be prevented from entering the dangerous area D.

The contents of an operating control process by the estimating apparatus 200 in the third operating example of the second embodiment will be described.

The contents of the operation control process by the estimating apparatus 200 in the third operation example are the same as the contents of the operation control process by the estimating apparatus 200 in the first operation example depicted in FIG. 21 except for the anxiety particle generating process at step S2104, and is, therefore, omitted in further description.

The anxiety particle generating process (step S2104) in the third operating example of the second embodiment will be described with reference to FIG. 25.

FIG. 25 is a flowchart of the contents of the anxiety particle generating process (step S2104) in the third operating example of the second embodiment. In the anxiety particle generating process (step S2104), the estimating apparatus 200 determines whether particles (p) having a high level of likelihood exist within a given time period (step S2501).

When such particles (p) do not exist (step S2501: NO), the estimating apparatus 200 identifies an anxiety particle ID from the contents of the anxiety particle ID list field in a record of the dangerous area table 400, and generates anxiety particles (a) corresponding to the identified anxiety particle ID, based on the anxiety particle table 600 (step S2502). The estimating apparatus 200 then proceeds to step S2105 depicted in FIG. 21.

When such particles (p) exist (step S2501: YES), the estimating apparatus 200 identifies the time at which the particle (p) having the highest likelihood exists (step S2503). The estimating apparatus 200 then calculates the range in which the vehicle ahead F can move at the current time, based on the state of the vehicle ahead F from the identified time to the current time (step S2504).

From the contents of the anxiety particle ID list field in a record of the dangerous area table 400 indicating that the calculated range in which the vehicle ahead F can move overlaps an area near the dangerous area D, the estimating apparatus 200 identifies an anxiety particle ID, based on the anxiety particle table 600 and generates anxiety particles (a) corresponding to the identified anxiety particle ID (step S2505). The estimating apparatus 200 then proceeds to step S2105 depicted in FIG. 21.

In this manner, the estimating apparatus 200 does not generate the anxiety particles (a) in an area near the dangerous area D in which the vehicle ahead F has no potential of entering, and thereby reduces the volume of processing. The estimating apparatus 200 generates the anxiety particles (a) in an area that is near the dangerous area D in which the vehicle ahead F may possibly enter. Therefore, the estimating apparatus 200 improves the accuracy of estimation of the position of the vehicle ahead F. As a result, when estimating the position of the vehicle ahead F to be in an area near the dangerous area D, the estimating apparatus 200 moves such that the vehicle ahead F can be prevented from entering the dangerous area D.

A fourth operation example of the estimating apparatus 200 according to the second embodiment will be described. The fourth operation example is a combination of the second operating example and the third operating example. In the fourth operation example, no anxiety particle (a) is generated when the accuracy of the position of the vehicle ahead F estimated by the vehicle C is high, and no anxiety particle (a) is generated in an area that is near the dangerous area D in which the vehicle ahead F has no potential of entering.

In this manner, when the accuracy of the current position of the vehicle ahead F is high, the vehicle C does not generate the anxiety particles (a), and thereby reduces the volume of processing. When the accuracy of the current position of the vehicle ahead F is low, the vehicle C generates the anxiety particles (a). Thus, when the position of the vehicle ahead F is in an area near the dangerous area D, the vehicle C can improve the accuracy of estimation of the position of the vehicle ahead F.

In this manner, the vehicle C does not generate the anxiety particles (a) in an area near the dangerous area D in which the vehicle ahead F has no potential of entering, and thereby reduces the volume of processing. The vehicle C generates the anxiety particles (a) in an area that is near the dangerous area D in which the vehicle ahead F may possibly enter. Therefore, the vehicle C improves the accuracy of estimation of the position of the vehicle ahead F. As a result, when estimating the position of the vehicle ahead F to be in an area near the dangerous area D, the vehicle C moves such that the vehicle ahead F can be prevented from entering the dangerous area D.

The contents of an operation control process by the estimating apparatus 200 in the fourth operation example of the estimating apparatus 200 according to the second embodiment will be described.

The contents of an operation control process by the estimating apparatus 200 in the fourth operation example are the same as the contents of the operation control process by the estimating apparatus 200 in the first operation example depicted in FIG. 21 except for the anxiety particle generating process at step S2104, and is, therefore, omitted in further description.

The anxiety particle generating process (step S2104) in the fourth operating example of the second embodiment will be described, with reference to FIG. 26.

FIG. 26 is a flowchart of the contents of the anxiety particle generating process (step S2104) in the fourth operation example of the second embodiment. In the anxiety particle generating process (step S2104), the estimating apparatus 200 determines whether the accuracy of the current position of the vehicle ahead F is high (step S2601). For example, when the sum of the likelihood levels of a particle group (ps) indicating the position of the vehicle ahead F at the time right before the current time is equal to or higher than the threshold, the estimating apparatus 200 determines the accuracy of the current position of the vehicle ahead F to be high. When the accuracy of the current position of the vehicle ahead F is high (step S2601: YES), the estimating apparatus 200 proceeds to step S2105 depicted in FIG. 21.

When the accuracy of the position of the vehicle ahead F is low (step S2601: NO), the estimating apparatus 200 determines whether particles (p) having a high level of likelihood exist within a given time period (step S2602). When such particles (p) do not exist (step S2602: NO), the estimating apparatus 200 identifies an anxiety particle ID from the contents of the anxiety particle ID list field in a record of the dangerous area table 400, and generates anxiety particles (a) corresponding to the identified anxiety particle ID, based on the anxiety particle table 600 (step S2603). The estimating apparatus 200 then proceeds to step S2105 depicted in FIG. 21.

When such particles (p) exist (step S2602: YES), the estimating apparatus 200 identifies the time at which the particle (p) having the highest likelihood exists (step S2604). The estimating apparatus 200 then calculates the range in which the vehicle ahead F can move at the current time, from the state of the vehicle ahead F from the identified time to the current time (step S2605).

From the contents of the anxiety particle ID list field in a record of the dangerous area table 400 indicating that the calculated range in which the vehicle ahead F can move overlaps an area near the dangerous area D, the estimating apparatus 200 identifies an anxiety particle ID, and generates anxiety particles (a) corresponding to the identified anxiety particle ID, based on the anxiety particle table 600 (step S2606). The estimating apparatus 200 then proceeds to step S2105 depicted in FIG. 21.

In this manner, when the accuracy of the current position of the vehicle ahead F is high, the estimating apparatus 200 does not generate the anxiety particles (a), and thereby reduces the volume of processing. When the accuracy of the current position of the vehicle ahead F is low, the estimating apparatus 200 generates the anxiety particles (a). Thus, when the position of the vehicle ahead F of the vehicle ahead F of the vehicle ahead F is in an area near the dangerous area D, the estimating apparatus 200 can improve the accuracy of estimation of the position of the vehicle ahead F of the vehicle ahead F of the vehicle ahead F.

In this manner, the estimating apparatus 200 does not generate the anxiety particles (a) in an area near the dangerous area D in which the vehicle ahead F has no potential of entering, and thereby reduces the volume of processing. The estimating apparatus 200 generates the anxiety particles (a) in an area that is near the dangerous area D in which the vehicle ahead F may possibly enter. Therefore, the estimating apparatus 200 improves the accuracy of estimation of the position of the vehicle ahead F. As a result, when estimating the position of the vehicle ahead F to be in an area near the dangerous area D, the estimating apparatus 200 moves such that the vehicle ahead F can be prevented from entering the dangerous area D.

As described above, the estimating apparatus 200 of the first embodiment generates not only the particle group (ps) indicating the state of the vehicle ahead F but also the anxiety particle group (as) indicating the state of the vehicle ahead F in an area near the dangerous area D. The estimating apparatus 200 carries out re-sampling based on the level of likelihood of each particle of the particle group (ps) and the level of likelihood of the anxiety particle group (as). The estimating apparatus 200 then re-estimates the state of the vehicle ahead F based on the particle group (ps) re-selected as a result of the re-sampling.

In this process, if the true position of the vehicle ahead F is in an area near the dangerous area D, the level of likelihood of the anxiety particle (a) is high. As a result, through re-sampling, the anxiety particle (a) indicating the state of the vehicle ahead F in an area near the dangerous area D is selected as a particle (p) of the particle group (ps). Thus, when the true position is in an area near the dangerous area D, the estimating apparatus 200 can improve the accuracy of estimation of the position of the vehicle ahead F by using the particle group (ps) re-selected as a result of the re-sampling.

The estimating apparatus 200 does not generate the anxiety particles (a) when the accuracy of the current position of the vehicle ahead F is high, and thereby reduces the volume of processing. The estimating apparatus 200 generates the anxiety particles (a) when the accuracy of the current position of the vehicle ahead F is low. At this time, if the true position of the vehicle ahead F is in an area near the dangerous area D, the level of likelihood of the anxiety particle (a) is high. As a result, through re-sampling, the anxiety particle (a) indicating the state of the vehicle ahead F to be in an area near the dangerous area D is selected as a particle (p) of the particle group (ps). Thus, when the position of the vehicle ahead F is in an area near the dangerous area D, the estimating apparatus 200 can improve the accuracy of estimation of the position of the vehicle ahead F by using the particle group (ps) re-selected as a result of the re-sampling.

An area near a dangerous area D that does not overlap a range in which the vehicle ahead F can move is an area that is near a dangerous area D in which the vehicle ahead F has no potential of entering. For such a case, the estimating apparatus 200 does not generate the anxiety particles (a), and thereby reduces the volume of processing. An area near a dangerous area D that overlaps the range in which the vehicle ahead F can move is an area near a dangerous area D in which the vehicle ahead F may possibly enter. For such a case, the estimating apparatus 200 generates the anxiety particles (a). At this time, if the true position of the vehicle ahead F is in an area near the dangerous area D, the level of likelihood of the anxiety particle (a) is high. As a result, through re-sampling, the anxiety particle (a) indicating the state of the vehicle ahead F to be in an area near the dangerous area D is selected as a particle (p) of the particle group (ps). Thus, when the position of the vehicle ahead F is in an area near the dangerous area D in which the mobile body may possibly enter, the estimating apparatus 200 can improve the accuracy of estimation of the position of the vehicle ahead F by using the particle group (ps) re-selected as a result of the re-sampling.

When the estimated position of the vehicle ahead F is in an area near the dangerous area D, the estimating apparatus 200 moves such that the vehicle ahead F is away from the dangerous area D. The estimating apparatus 200, therefore, can prevent the vehicle ahead F from entering the dangerous area D.

The estimating method described in the present embodiment may be implemented by executing a prepared program on a computer such as a personal computer and a workstation. The program is stored on a computer-readable recording medium such as a hard disk, a flexible disk, a CD-ROM, an MO, and a DVD, read out from the computer-readable medium, and executed by the computer. The program may be distributed through a network such as the Internet.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An estimating apparatus comprising a sensor and a processor configured to:
   update a state of a first particle group indicating a state of a mobile body, from a current state to a next state through a simulation that is based on a state equation of the mobile body in a space using a particle filter,
   measure at each update, using the sensor, a distance between the mobile body and an object in the space,
   generate at each update, a second particle group indicating a state of a specific area in the space,
   calculate a level of likelihood for each particle of the first particle group and for each particle of the second particle group, based on the measured distance, the updated first particle group, and the generated second particle group, and
   identify a position of the mobile body in the space, based on the level of likelihood calculated for each particle.

2. The estimating apparatus according to claim 1, the processor further configured to determine if one of the levels of likelihood calculated is equal to or larger than a threshold, and when determining that said one of the levels of likelihood is equal to or larger than the threshold, stops generating the second particle group.

3. The estimating apparatus according to claim 1, the processor further configured to:
   determine if one of the levels of likelihood calculated is equal to or larger than a threshold, and
   set a movement range for the mobile body, based on a position of the mobile body in the space at a point of in time when said one of the levels of likelihood determined to be equal to or higher than the threshold is obtained, wherein
   the processor generates the second particle group in a neighboring area that overlaps the set movement range.

4. The estimating apparatus according to claim 1, the processor further configured to:
   judge whether the identified position of the mobile body is in the specific area, and
   perform control to cause the mobile body to move in a direction away from the specific area when judging that the mobile body is in the specific area.

5. An estimating method executed by a computer in a mobile body, the estimating method comprising:
   updating a state of a first particle group indicating a state of the mobile body, from a current state to a next state through a simulation that is based on a state equation of the mobile body in a space using a particle filter;
   measuring at each update, using a sensor, a distance between the mobile body and an object in the space;
   generating at each update, a second particle group indicating a state of a specific area in the space;
   calculating a level of likelihood for each particle of the first particle group and for each particle of the second particle group, based on the measured distance, the updated first particle group, and the generated second particle group, and
   identifying a position of the mobile body in the space, based on the level of likelihood calculated for each particle.

6. An estimating method executed by a computer in an object, the estimating method comprising:
   updating a state of a first particle group indicating a state of a mobile body, from a current state to a next state through a simulation that is based on a state equation of the mobile body in a space using a particle filter;
   measuring at each update, using a sensor, a distance between the mobile body and the object in the space;
   generating at each update, a second particle group indicating a state of a specific area in the space;
   calculating a level of likelihood for each particle of the first particle group and for each particle of the second particle group, based on the measured distance, the updated first particle group, and the generated second particle group, and
   identifying a position of the mobile body in the space, based on the level of likelihood calculated for each particle.

7. A non-transitory computer-readable recording medium storing a program for causing a computer in a mobile body to execute an estimating process comprising:
   updating a state of a first particle group indicating a state of the mobile body, from a current state to a next state through a simulation that is based on a state equation of the mobile body in a space using a particle filter;
   measuring at each update, using a sensor, a distance between the mobile body and an object in the space;
   generating at each update, a second particle group indicating a state of a specific area in the space;
   calculating a level of likelihood for each particle of the first particle group and for each particle of the second particle group, based on the measured distance, the updated first particle group, and the generated second particle group, and
   identifying a position of the mobile body in the space, based on the level of likelihood calculated for each particle.

8. A non-transitory computer-readable recording medium storing a program for causing a computer in an object to execute an estimating process comprising:
   updating a state of a first particle group indicating a state of a mobile body, from a current state to a next state through a simulation that is based on a state equation of the mobile body in a space using a particle filter;
   measuring at each update, using a sensor, a distance between the mobile body and the object in the space;
   generating at each update, a second particle group indicating a state of a specific area in the space;
   calculating a level of likelihood for each particle of the first particle group and for each particle of the second particle group, based on the measured distance, the updated first particle group, and the generated second particle group, and
   identifying a position of the mobile body in the space, based on the level of likelihood calculated for each particle.

* * * * *